US010103624B2

(12) United States Patent
Lin et al.

(10) Patent No.: US 10,103,624 B2
(45) Date of Patent: Oct. 16, 2018

(54) THERMAL SENSOR CIRCUIT

(71) Applicant: WIN Semiconductors Corp., Tao Yuan (TW)

(72) Inventors: Re Ching Lin, Tao Yuan (TW); Fan Hsiu Huang, Tao Yuan (TW); Tung-Yao Chou, Tao Yuan (TW); Cheng Kuo Lin, Tao Yuan (TW); Shu Hsiao Tsai, Tao Yuan (TW); Chih-Feng Chiang, Tao Yuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 15/634,528

(22) Filed: Jun. 27, 2017

(65) Prior Publication Data

US 2018/0006556 A1    Jan. 4, 2018

Related U.S. Application Data

(60) Provisional application No. 62/356,227, filed on Jun. 29, 2016.

(51) Int. Cl.
| | |
|---|---|
| *H02M 3/156* | (2006.01) |
| *G01K 11/26* | (2006.01) |
| *G01K 7/34* | (2006.01) |
| *G01K 7/01* | (2006.01) |

(52) U.S. Cl.
CPC .............. *H02M 3/156* (2013.01); *G01K 7/01* (2013.01); *G01K 7/34* (2013.01); *G01K 11/26* (2013.01); *G01K 11/265* (2013.01)

(58) Field of Classification Search
CPC ........ H02M 3/10; H02M 3/155; H02M 3/156; H02M 3/157; G05F 1/462; G05F 1/56; G01K 11/265; G01K 11/26; G01K 7/00; G01K 7/01; G01K 7/34
USPC ................ 323/265, 282, 283, 284, 285, 351
See application file for complete search history.

(56) References Cited

U.S. PATENT DOCUMENTS

| | | | | |
|---|---|---|---|---|
| 5,359,236 A | * | 10/1994 | Giordano | G01K 7/01 327/378 |
| 5,422,832 A | * | 6/1995 | Moyal | G01K 7/01 323/907 |
| 2005/0001670 A1 | * | 1/2005 | Kim | G01K 7/01 327/512 |
| 2018/0003570 A1 | * | 1/2018 | Lin | G01K 11/265 |
| 2018/0006633 A1 | * | 1/2018 | Lin | H03H 9/6489 |

* cited by examiner

*Primary Examiner* — Adolf Berhane
(74) *Attorney, Agent, or Firm* — Muncy, Geissler, Olds & Lowe, P.C.

(57) ABSTRACT

A thermal sensor circuit comprises a conversion circuit which is one of a buck DC-DC converter circuit and a boost DC-DC converter circuit, wherein the conversion circuit comprises an inductor and an output terminal. A thermal sensor senses a thermal variation correlated to a capacitance variation of the thermal sensor. The capacitance variation induces an internal parasitic capacitance variation of the inductor which is connected in parallel to the thermal sensor and results a variation of an energy stored in the inductor. Hence a variation of a converted circuit signal outputting by the output terminal is caused, wherein the variation of the converted circuit signal is correlated to the thermal variation.

10 Claims, 21 Drawing Sheets

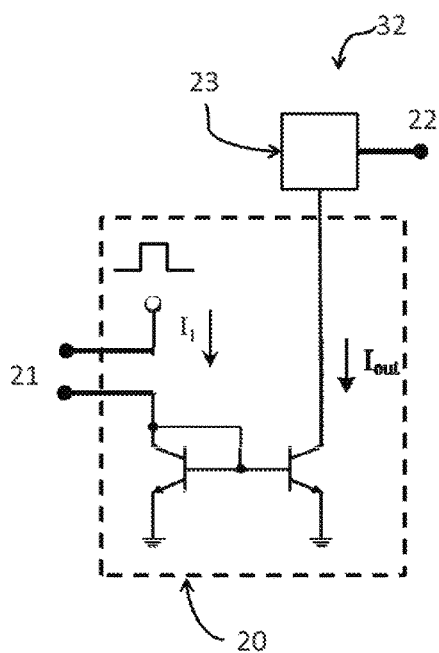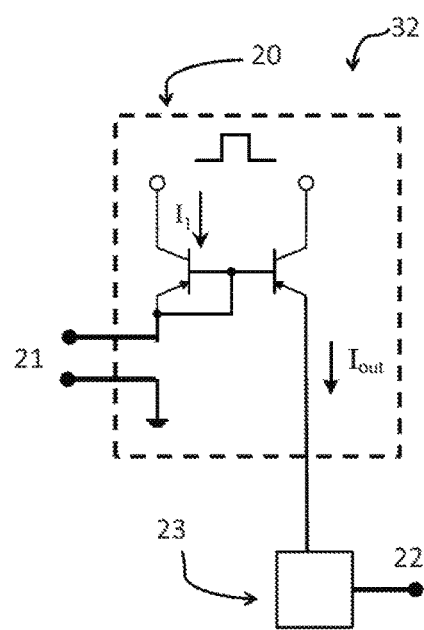
Fig. 2R  Fig. 2S
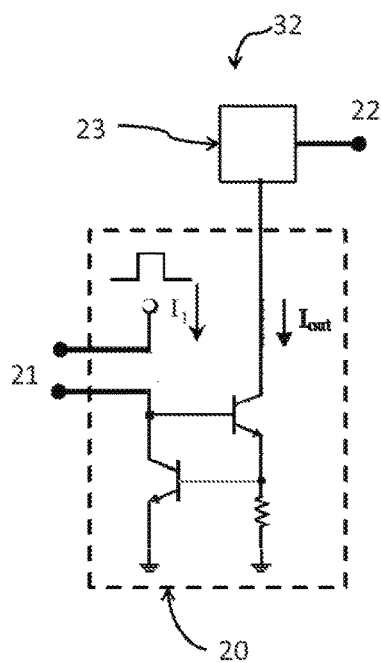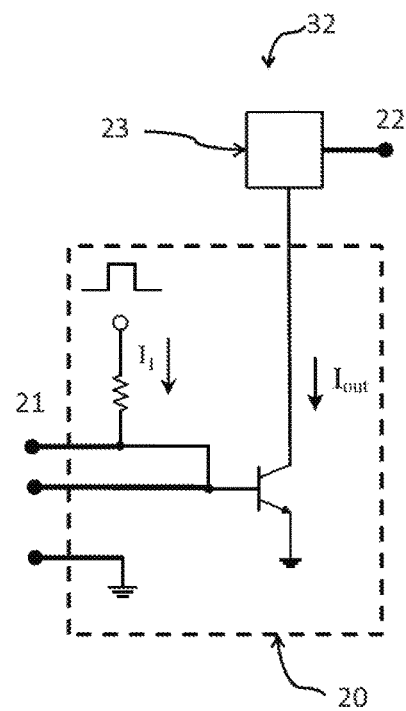
Fig. 2T  Fig. 2U

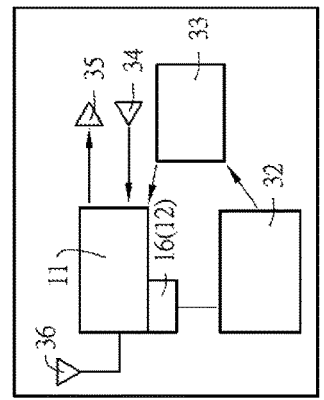
Fig. 4B
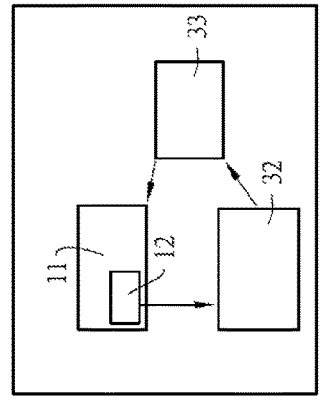
Fig. 4D
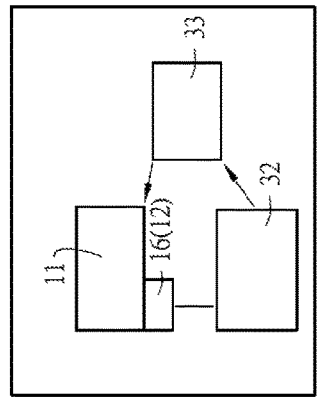
Fig. 4A
Fig. 4C

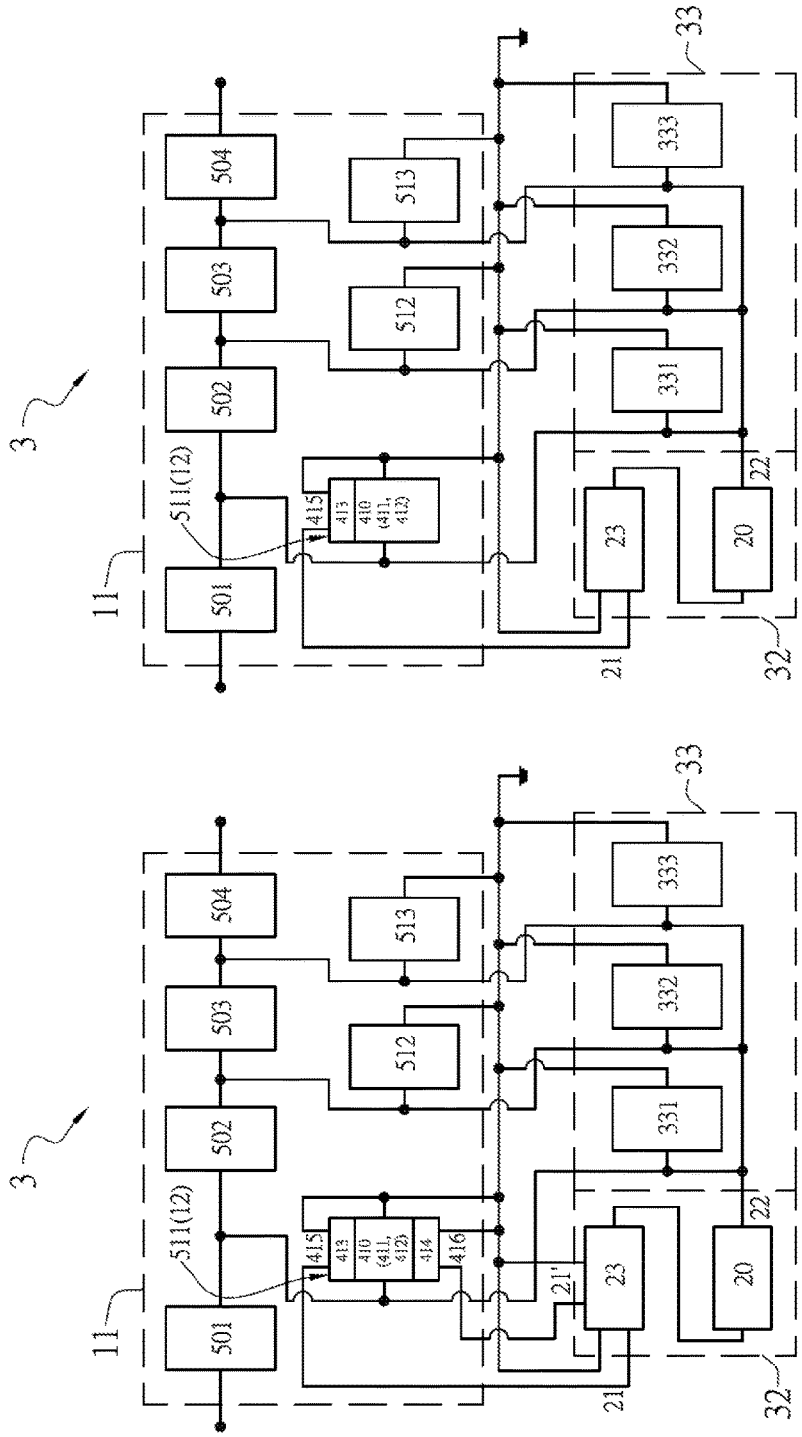

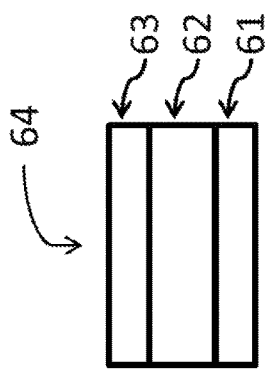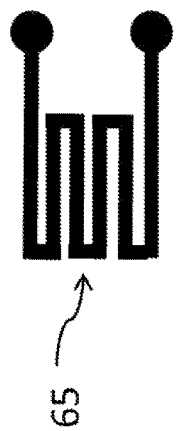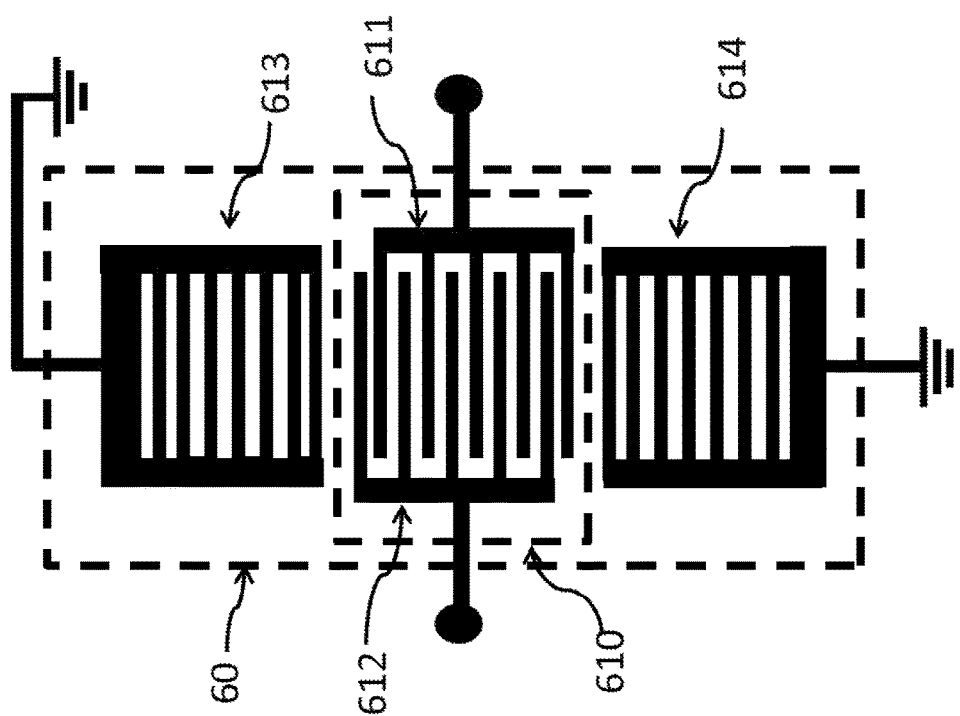
Fig. 6B
Fig. 6C
Fig. 6A

THERMAL SENSOR CIRCUIT

CROSS-REFERENCE TO RELATED DOCUMENTS

This patent application claims priority from and is related to U.S. Provisional Patent Application Ser. No. 62/356,227, filed 29 Jun. 2016.

FIELD OF THE INVENTION

The present invention is related to a thermal sensor circuit, especially a thermal sensor circuit for thermal sensing acoustic wave resonator.

BACKGROUND OF THE INVENTION

Please refer to FIG. 6A, which is the sectional schematic view of a surface acoustic wave resonator of conventional technology. A surface acoustic wave resonator 60 comprises two interlocking comb-shaped electrodes 611, 612 of an interdigital transducer 610 and two grating reflectors 613, 614. The two interlocking comb-shaped electrodes 611, 612 of the interdigital transducer 610 and the two grating reflectors 613, 614 are formed on a piezoelectric substrate. The two grating reflectors 613, 614 are formed respectively at two sides of the two interlocking comb-shaped electrodes 611, 612 of the interdigital transducer 610. However, the interdigital transducer 610 of the surface acoustic wave resonator 60 is sensitive to thermal variation. A thermal variation will cause a variation of the resonance frequency of the surface acoustic wave resonator 60. Also a thermal variation will cause a variation of an equivalent parallel capacitance of the interdigital transducer 610 of the surface acoustic wave resonator 60. Please also refer to FIG. 6B, which is the sectional schematic view of an acoustic wave resonance structure of a bulk acoustic wave resonator of conventional technology. In conventional technology, a bulk acoustic wave resonator (BAW) or a thin film bulk acoustic wave resonator (FBAR) has an acoustic wave resonance structure 64. The acoustic wave resonance structure 64 comprises a bottom electrode 61, a piezoelectric layer 62 and a top electrode 63. The piezoelectric layer 62 is formed on the bottom electrode 61. The top electrode 63 is formed on the piezoelectric layer 62. However, the acoustic wave resonance structure 64 of the bulk acoustic wave resonator (or the thin film bulk acoustic wave resonator) is sensitive to thermal variation. A thermal variation will cause a variation of the resonance frequency of the acoustic wave resonance structure 64 of the bulk acoustic wave resonator (or the thin film bulk acoustic wave resonator). Also a thermal variation will cause a variation of an equivalent parallel capacitance of the acoustic wave resonance structure 64 of the bulk acoustic wave resonator (or the thin film bulk acoustic wave resonator). Therefore, a thermal sensor and an active thermal compensating circuit are needed for the surface acoustic wave resonator 60 (SAW), the bulk acoustic wave resonator (BAW) and the thin film bulk acoustic wave resonator (FBAR). And also a thermal compensation method is needed.

Please refer to FIG. 6C, which is the sectional schematic view of a thermal sensitive resistance sensor of conventional technology. A thermal sensitive resistance sensor 65 has a meandered-shape. In conventional technology, the thermal sensitive resistance sensor 65 is positioned near the surface acoustic wave resonator 60, the bulk acoustic wave resonator or the thin film bulk acoustic wave resonator for sensing a thermal variation. However, it costs further effort to form a thermal sensor near the acoustic wave resonator.

A conventional buck DC-DC converter circuit is usually used for stepping down voltage from its input to its output. A conventional boost DC-DC converter circuit is usually used for stepping up voltage from its input to its output. But no one has applied the conventional buck DC-DC converter circuit or the conventional boost DC-DC converter circuit as a thermal sensor circuit, especially a thermal sensor circuit for a thermal sensor which senses a thermal variation correlated to a capacitance variation of the thermal sensor.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

Since the interdigital transducer of the surface acoustic wave resonator is sensitive to thermal variation. A thermal variation will cause a variation of the resonance frequency of the surface acoustic wave resonator. Also a thermal variation will cause a variation of an equivalent parallel capacitance of the interdigital transducer of the surface acoustic wave resonator. Therefore, the present invention provides a thermal sensing acoustic wave resonator (which is a surface acoustic wave resonator) as a thermal sensor. The interdigital transducer of the thermal sensing acoustic wave resonator can play a role of acoustic wave filtering, at the same time, and a role of thermal sensing. The interdigital transducer of the thermal sensing acoustic wave resonator senses a thermal variation correlated to a variation of an equivalent parallel capacitance of the interdigital transducer of the thermal sensing acoustic wave resonator or a variation of the resonance frequency of the thermal sensing acoustic wave resonator.

Furthermore, since the acoustic wave resonance structure of the bulk acoustic wave resonator (or the thin film bulk acoustic wave resonator) is sensitive to thermal variation. A thermal variation will cause a variation of the resonance frequency of the acoustic wave resonance structure of the bulk acoustic wave resonator (or the thin film bulk acoustic wave resonator). Also a thermal variation will cause a variation of an equivalent parallel capacitance of the acoustic wave resonance structure of the bulk acoustic wave resonator (or the thin film bulk acoustic wave resonator). Therefore, the present invention provides a thermal sensing acoustic wave resonator (which is a bulk acoustic wave resonator or a thin film bulk acoustic wave resonator) as a thermal sensor. The acoustic wave resonance structure of the thermal sensing acoustic wave resonator can play a role of acoustic wave filtering, at the same time, and a role of thermal sensing. The acoustic wave resonance structure of the thermal sensing acoustic wave resonator senses a thermal variation correlated to a variation of an equivalent parallel capacitance of the acoustic wave resonance structure of the thermal sensing acoustic wave resonator or a variation of the resonance frequency of the thermal sensing acoustic wave resonator.

Furthermore, by modifying a buck DC-DC converter circuit (or a boost DC-DC converter circuit), the present invention provides a thermal sensor circuit for a thermal sensor which senses a thermal variation correlated to a capacitance variation of the thermal sensor. Moreover, by modifying a buck DC-DC converter circuit (or a boost DC-DC converter circuit), the present invention provides a thermal sensor circuit for a thermal sensitive diode sensor which senses a thermal variation correlated to a variation of a forward voltage of the thermal sensitive diode sensor.

The present invention further provides a thermal sensor circuit. The thermal sensor circuit comprises a conversion circuit, wherein the conversion circuit is one selected from the group consisting of a buck DC-DC converter circuit and a boost DC-DC converter circuit. The conversion circuit comprises: an inductor and an output terminal of the conversion circuit. The inductor is connected in parallel to a thermal sensor. The output terminal of the conversion circuit outputs a converted circuit signal. The thermal sensor senses a thermal variation correlated to a capacitance variation of the thermal sensor. The capacitance variation of the thermal sensor induces a variation of an internal parasitic capacitance of the inductor causing a variation of an energy stored in the inductor, thereby the variation of the energy stored in the inductor causes a variation of the converted circuit signal, hence the variation of the converted circuit signal is correlated to the thermal variation.

In an embodiment, the conversion circuit is a buck DC-DC converter circuit. The conversion circuit further comprises: a DC source, a switching transistor, a pulse generator, a diode and a capacitor. A first terminal of the switching transistor is connected to the DC source. A second terminal of the switching transistor is connected to a first terminal of the inductor and a cathode terminal of the diode. A third terminal of the switching transistor is connected to the pulse generator. A second terminal of the inductor is connected to the output terminal of the conversion circuit and a first terminal of the capacitor. An anode terminal of the diode and a second terminal of the capacitor are grounded.

In an embodiment, the conversion circuit is a boost DC-DC converter circuit, wherein the conversion circuit further comprises: a DC source, a switching transistor, a pulse generator, a diode and a capacitor. A first terminal of the inductor is connected to the DC source. A second terminal of the inductor is connected to a first terminal of the switching transistor and an anode terminal of the diode. A cathode terminal of the diode is connected to the output terminal of the conversion circuit and a first terminal of the capacitor. A second terminal of the switching transistor and a second terminal of the capacitor are grounded. A third terminal of the switching transistor is connected to the pulse generator.

In an embodiment, the thermal sensor is a thermal sensing acoustic wave resonator which is one selected from the group consisting of a bulk acoustic wave resonator (BAW), a thin film bulk acoustic wave resonator (FBAR) and a surface acoustic wave resonator (SAW).

In an embodiment, the thermal sensing acoustic wave resonator is formed on a substrate. The material of the substrate is one material selected from the group consisting of glass, $LiTaO_3$, $LiNbO_3$, quartz, Si, GaAs, GaP, sapphire, $Al_2O_3$, InP, SiC, diamond, GaN and AlN.

In an embodiment, further comprising a bias adjustment circuit. The conversion circuit and the bias adjustment circuit form an active adjustment circuit. An input terminal of the bias adjustment circuit is connected to the output terminal of the conversion circuit. The bias adjustment circuit adjusts the converted circuit signal received from the output terminal of the conversion circuit and outputs an active thermal compensating signal through an output terminal of the active adjustment circuit.

The present invention further provides a thermal sensor circuit. The thermal sensor circuit comprises a conversion circuit, wherein the conversion circuit comprises: a DC source, a switching transistor, a pulse generator, an inductor, a capacitor and an output terminal of the conversion circuit. The output terminal of the conversion circuit outputs a converted circuit signal. A first terminal of the switching transistor is connected to the DC source. A second terminal of the switching transistor is connected to a cathode terminal of a thermal sensitive diode sensor and a first terminal of the inductor. A third terminal of the switching transistor is connected to the pulse generator. A second terminal of the inductor is connected to the output terminal of the conversion circuit and a first terminal of the capacitor. An anode terminal of the thermal sensitive diode sensor and a second terminal of the capacitor are grounded. The thermal sensitive diode sensor senses a thermal variation correlated to a variation of a forward voltage of the thermal sensitive diode sensor. The variation of the forward voltage of the thermal sensitive diode sensor causes a variation of the converted circuit signal, hence the variation of the converted circuit signal is correlated to the thermal variation.

In an embodiment, further comprising a bias adjustment circuit. The conversion circuit and the bias adjustment circuit form an active adjustment circuit. An input terminal of the bias adjustment circuit is connected to the output terminal of the conversion circuit. The bias adjustment circuit adjusts the converted circuit signal received from the output terminal of the conversion circuit and outputs an active thermal compensating signal through an output terminal of the active adjustment circuit.

The present invention further provides a thermal sensor circuit. The thermal sensor circuit comprises a conversion circuit, wherein the conversion circuit comprises: a DC source, a switching transistor, a pulse generator, an inductor, a capacitor and an output terminal of the conversion circuit. The output terminal of the conversion circuit outputs a converted circuit signal. A first terminal of the inductor is connected to the DC source. A second terminal of the inductor is connected to an anode terminal of a thermal sensitive diode sensor and a second terminal of the switching transistor. A third terminal of the switching transistor is connected to the pulse generator. A cathode terminal of the thermal sensitive diode sensor is connected to the output terminal of the conversion circuit and a first terminal of the capacitor. A first terminal of the switching transistor and a second terminal of the capacitor are grounded. The thermal sensitive diode sensor senses a thermal variation correlated to a variation of a forward voltage of the thermal sensitive diode sensor. The variation of the forward voltage of the thermal sensitive diode sensor causes a variation of the converted circuit signal, hence the variation of the converted circuit signal is correlated to the thermal variation.

In an embodiment, further comprising a bias adjustment circuit. The conversion circuit and the bias adjustment circuit form an active adjustment circuit. An input terminal of the bias adjustment circuit is connected to the output terminal of the conversion circuit. The bias adjustment circuit adjusts the converted circuit signal received from the output terminal of the conversion circuit and outputs an active thermal compensating signal through an output terminal of the active adjustment circuit.

For further understanding the characteristics and effects of the present invention, some preferred embodiments referred to drawings are in detail described as follows.

BRIEF DESCRIPTION OF DRAWINGS

FIGS. 2Q~2W are the schematic views of the embodiments of an active adjustment circuit of the present invention.

FIGS. 4A~4H are the schematic views of the embodiments of an integrated module of acoustic wave device with active thermal compensation of the present invention.

FIGS. 5A~5D are the schematic views of the embodiments of an integrated module of acoustic wave device with active thermal compensation of the present invention.

FIG. 6A is the sectional schematic view of a surface acoustic wave resonator of conventional technology.

FIG. 6B is the sectional schematic view of an acoustic wave resonance structure of a bulk acoustic wave resonator of conventional technology.

FIG. 6C is the sectional schematic view of a thermal sensitive resistance sensor of conventional technology.

DETAILED DESCRIPTIONS OF PREFERRED EMBODIMENTS

Figure 1A:
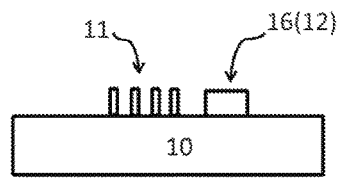
FIG. 1A is the sectional schematic view of an embodiment of a thermal sensor integrated with acoustic wave device of the present invention.

Please refer to FIG. 1A, which shows the sectional schematic view of an embodiment of a thermal sensor integrated with acoustic wave device of the present invention. The thermal sensor integrated with acoustic wave device comprises an acoustic wave device 11 and a thermal 16(12), wherein the acoustic wave device 11 and the thermal 16(12) are formed on a first substrate 10. In some embodiments, the thermal 16(12) may be located close to the acoustic wave device 11 for sensing the thermal variation nearby the acoustic wave device 11. In some embodiments, the acoustic wave device 11 comprises at least one acoustic wave resonator. In some other embodiments, the acoustic wave device 11 comprises at least one acoustic wave filter, wherein each of the at least one acoustic wave filter comprises at least one acoustic wave resonator. In some embodiments, the acoustic wave device 11 comprises at least one acoustic wave duplexer, wherein each of the at least one acoustic wave duplexer comprises at least one acoustic wave filter, wherein each of the at least one acoustic wave filter comprises at least one acoustic wave resonator. In some other embodiments, the acoustic wave device 11 comprises at least one acoustic wave diplexer, wherein each of the at least one acoustic wave diplexer comprises at least one acoustic wave filter, wherein each of the at least one acoustic wave filter comprises at least one acoustic wave resonator. In some embodiments, the material of the first substrate 10 is one material selected from the group consisting of glass, $LiTaO_3$, $LiNbO_3$, quartz, Si, GaAs, GaP, sapphire, $Al_2O_3$, InP, SiC, diamond, GaN and AlN. In some embodiments of the present invention, the acoustic wave resonator may be a bulk acoustic wave resonator (BAW) or a thin film bulk acoustic wave resonator (FBAR). The bulk acoustic wave resonator (or the thin film bulk acoustic wave resonator) comprises an acoustic wave resonance structure which is the same as the acoustic wave resonance structure 64 shown in FIG. 6B. In some other embodiments of the present invention, the acoustic wave resonator may be a surface acoustic wave resonator (SAW). The surface acoustic wave resonator has the same structure shown in FIG. 6A. The thermal sensor 16 includes at least one selected from the group consisting of a sensing capacitance variation type thermal sensor, a sensing resistance variation type thermal sensor, a sensing inductance variation type thermal sensor, a sensing current variation type thermal sensor, a sensing voltage variation type thermal sensor and a sensing resonance frequency variation type thermal sensor. The thermal sensor 16 includes at least one selected from the group consisting of a thermal sensitive capacitance, a thermal sensitive resistance (the same as the thermal sensitive resistance sensor 64 shown in FIG. 6C), a thermal sensitive diode sensor and a thermal sensitive transistor sensor. In some embodiments, the thermal sensor 16 comprises at least one output terminal. A thermal sensor 16 senses a thermal variation correlated to a physical property variation of the thermal sensor 16. The physical property variation includes at least one selected from the group consisting of a capacitance variation, a resistance variation, an inductance variation, a current variation and a voltage variation and a resonance frequency variation.

In some embodiments, the thermal sensor 16 may be a thermal sensing acoustic wave resonator 12. The present invention provides three types of the thermal sensing acoustic wave resonator 12. The first type of the thermal sensing acoustic wave resonator 12 may be a surface acoustic wave resonator. The surface acoustic wave resonator has the same structure shown in FIG. 6A. The thermal sensing acoustic wave resonator 12 comprises two interlocking comb-shaped electrodes of an interdigital transducer and two grating reflectors (the same as the two interlocking comb-shaped electrodes 611, 612 of the interdigital transducer 610 and two grating reflectors 613, 614 shown in FIG. 6A). The thermal sensing acoustic wave resonator 12 senses a thermal variation correlated to a capacitance variation and a resonance frequency variation of the two interlocking comb-shaped electrodes of the interdigital transducer of the thermal sensing acoustic wave resonator 12. The first type of the thermal sensing acoustic wave resonator 12 may be formed on a substrate. The material of the substrate is one material selected from the group consisting of glass, LiTaO$_3$, LiNbO$_3$, quartz, Si, GaAs, GaP, sapphire, Al$_2$O$_3$, InP, SiC, diamond, GaN and AlN.

The second type of the thermal sensing acoustic wave resonator 12 may be a bulk acoustic wave resonator or a thin film bulk acoustic wave resonator, wherein the thermal sensing acoustic wave resonator 12 comprises an acoustic wave resonance structure which is the same as the acoustic wave resonance structure 64 shown in FIG. 6B. The acoustic wave resonance structure comprises a bottom electrode, a piezoelectric layer and a top electrode, wherein the piezoelectric layer is formed on the bottom electrode, wherein the top electrode is formed on the piezoelectric layer (the same as the bottom electrode 61, the piezoelectric layer 62 and the top electrode 63). The material of the piezoelectric layer is at least one material selected from the group consisting of AlN, quartz, monocrystalline SiO$_2$, ZnO, HfO$_2$, barium strontium titanate (BST) and lead zirconate titanate (PZT). The thermal sensing acoustic wave resonator 12 senses a thermal variation correlated to a capacitance variation and a resonance frequency variation of the acoustic wave resonance structure of the thermal sensing acoustic wave resonator 12. The second type of the thermal sensing acoustic wave resonator 12 may be formed on a substrate. The material of the substrate is one material selected from the group consisting of glass, LiTaO$_3$, LiNbO$_3$, quartz, Si, GaAs, GaP, sapphire, Al$_2$O$_3$, InP, SiC, diamond, GaN and AlN.

Figure 1C:
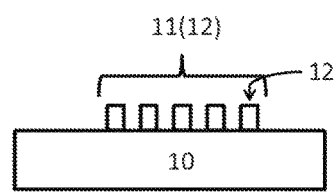
FIG. 1C is the sectional schematic view of an embodiment of an acoustic wave device having a thermal sensor of the present invention.
Figure 1B:
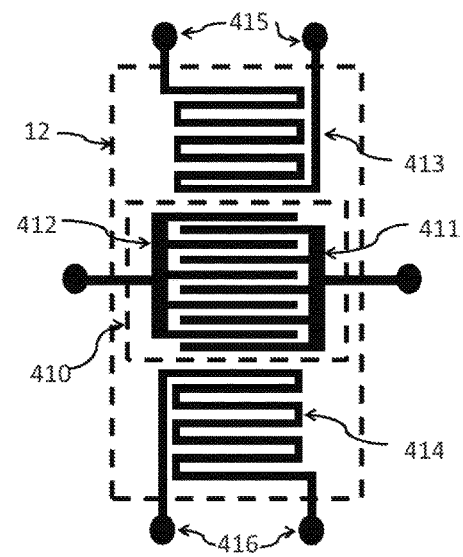
FIG. 1B is the top view of an embodiment of a thermal sensing acoustic wave resonator having a meandered-shaped reflector of the present invention.

Please refer to FIG. 1B, which shows the top view of an embodiment of a thermal sensing acoustic wave resonator having a meandered-shaped reflector of the present invention. The embodiment of FIG. 1B is the third type of the thermal sensing acoustic wave resonator 12 of the present invention. The third type of the thermal sensing acoustic wave resonator 12 is a new design of a surface acoustic wave resonator. The thermal sensing acoustic wave resonator 12 comprises a first meandered-shaped reflector 413, a second meandered-shaped reflector 414 and two interlocking comb-shaped electrodes 411, 412 of an interdigital transducer 410. The two meandered-shaped reflectors 413, 414 and the two interlocking comb-shaped electrodes 411, 412 of the interdigital transducer 410 may be formed on a substrate. The material of the substrate is one material selected from the group consisting of glass, LiTaO$_3$, LiNbO$_3$, quartz, Si, GaAs, GaP, sapphire, Al$_2$O$_3$, InP, SiC, diamond, GaN and AlN. The two meandered-shaped reflectors 413, 414 are formed respectively at two sides of the two interlocking comb-shaped electrodes 411, 412 of the interdigital transducer 410. In current embodiment, there are two meandered-shaped reflectors 413, 414. In some other embodiments, there is only one meandered-shaped reflector (the first meandered-shaped reflector 413 or the second meandered-shaped reflector 414). In the present invention, a new design of the meandered-shaped reflector (the first meandered-shaped reflector 413 or the second meandered-shaped reflector 414) can be used as a thermal sensitive resistance sensor. The meandered-shaped reflector (the first meandered-shaped reflector 413 or the second meandered-shaped reflector 414) senses a thermal variation correlated to a resistance variation of the meandered-shaped reflector (the first meandered-shaped reflector 413 or the second meandered-shaped reflector 414). The thermal sensing acoustic wave resonator 12 further comprises an output terminal 415 of the first meandered-shaped reflector 413 and an output terminal 416 of the second meandered-shaped reflector 414 for connection.

Please refer to FIG. 1C, which shows the sectional schematic view of an embodiment of an acoustic wave device having a thermal sensor of the present invention. The main structure of the embodiment in FIG. 1C is basically the same as the structure of the embodiment in FIG. 1A, except that the thermal sensing acoustic wave resonator 12 is a first type, a second type or a third type of the thermal sensing acoustic wave resonator 12 and the acoustic wave device 11 comprises the thermal sensing acoustic wave resonator 12. In current embodiment, the thermal sensing acoustic wave resonator 12 plays dual roles of thermal sensing and acoustic wave filtering. For example, in some embodiments, the thermal sensing acoustic wave resonator 12 is a third type of the thermal sensing acoustic wave resonator 12. The two interlocking comb-shaped electrodes 411, 412 of the interdigital transducer 410 may play a role of acoustic wave filtering, while the meandered-shaped reflector (the first meandered-shaped reflector 413 or the second meandered-shaped reflector 414) may play a role of thermal sensing. Some other embodiments will be discussed later in the embodiments of FIG. 1I, 1J, 4C, 4G, 4H, 5A~5E and 5I~5L.

Figure 1D:
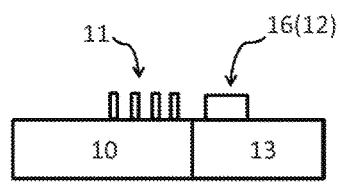
FIGS. 1D and 1E are the sectional schematic views of the embodiments of a thermal sensor integrated with acoustic wave device of the present invention.

Please refer to FIG. 1D, which shows the sectional schematic view of another embodiment of a thermal sensor integrated with acoustic wave device of the present invention. The main structure of the embodiment in FIG. 1D is basically the same as the structure of the embodiment in FIG. 1A, except that the thermal sensor 16(12) is formed on a second substrate 13. In some embodiments, the second substrate 13 may be positioned close to the first substrate 10. In some embodiments, the second substrate 13 may be bonded with the first substrate 10.

Figure 1E:
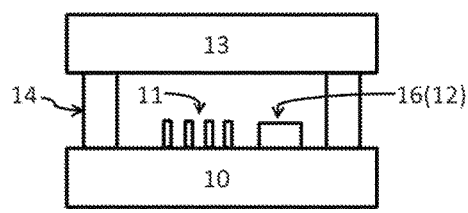

Please refer to FIG. 1E, which shows the sectional schematic views of another embodiment of a thermal sensor integrated with acoustic wave device of the present invention. The main structure of the embodiment in FIG. 1E is basically the same as the structure of the embodiment in FIG. 1D, except that the second substrate 13 and the first substrate 10 are stacked with each other, wherein each of at least one metal pillars 14 are formed on one of the first substrate 10 and the second substrate 13 and connected with the other.

Figure 1F:
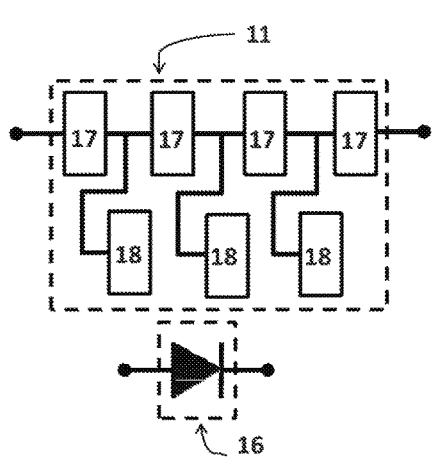
FIG. 1F is the schematic view of an embodiment of a thermal sensitive diode sensor integrated with acoustic wave device of the present invention.

Please refer to FIG. 1F, which shows the schematic view of an embodiment of a thermal sensitive diode sensor integrated with acoustic wave device of the present invention. In current embodiment, the acoustic wave device 11 is an acoustic wave filter. The acoustic wave filter comprises four series acoustic wave resonators 17 and three shunt acoustic wave resonators 18. Each of the series acoustic wave resonators 17 and the shunt acoustic wave resonators 18 is one of a surface acoustic wave resonator, a bulk acoustic wave resonator and a thin film bulk acoustic wave resonator. That is that the four series acoustic wave resonators 17 and the three shunt acoustic wave resonators 18 are the same type of acoustic wave resonators of (i) surface acoustic wave resonators, (ii) bulk acoustic wave resonators, or (iii) thin film bulk acoustic wave resonators. The four series acoustic wave resonators 17 are connected in series. Each of the three shunt acoustic wave resonators 18 is connected to a junction between two adjacent series acoustic wave resonators 17. The thermal sensor 16 is a thermal sensitive diode sensor. The thermal sensitive diode sensor senses a thermal variation correlated to at least one of a resistance variation, a current variation and a voltage variation. In some embodiment, the thermal sensitive diode sensor senses a thermal variation correlated to a variation of a forward voltage of the thermal sensitive diode sensor. In some embodiments, the acoustic wave device 11 and the thermal sensitive diode sensor 16 may be formed on a first substrate 10 (as shown in FIG. 1A). In some other embodiments, the acoustic wave device 11 may be formed on a first substrate 10 while the thermal sensitive diode sensor 16 may be formed on a second substrate 13 (as shown in FIG. 1D). In some embodiments, the acoustic wave device 11 may be formed on a first substrate 10 while the thermal sensitive diode sensor 16 may be formed on a second substrate 13, wherein the first substrate 10 and the second substrate 13 are stacked with each other, wherein each of at least one metal pillars 14 are formed on one of the first substrate 10 and the second substrate 13 and connected with the other (as shown in FIG. 1E).

Figure 1I:
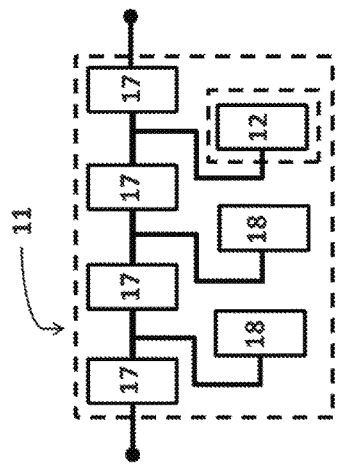
FIGS. 1G~1J are the schematic views of the embodiments of a thermal sensing acoustic wave resonator integrated with acoustic wave device of the present invention.
Figure 1J:
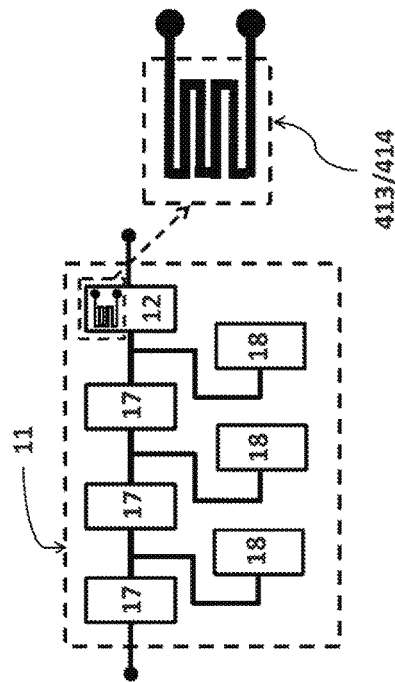
Figure 1G:
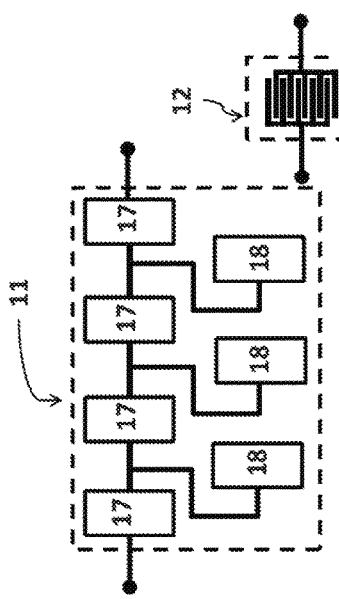

Please refer to FIG. 1G, which shows the schematic view of an embodiment of a thermal sensing acoustic wave resonator integrated with acoustic wave device of the present invention. In current embodiment, the acoustic wave device 11 is an acoustic wave filter. The acoustic wave filter comprises four series acoustic wave resonators 17 and three shunt acoustic wave resonators 18. The series acoustic wave resonators 17 and the shunt acoustic wave resonators 18 are surface acoustic wave resonators. The four series acoustic wave resonators 17 are connected in series. Each of the three shunt acoustic wave resonators 18 is connected to a junction between two adjacent series acoustic wave resonators 17. The thermal sensing acoustic wave resonator 12 is a surface acoustic wave resonator, that is, the first type of the thermal sensing acoustic wave resonator 12 of the present invention. The thermal sensing acoustic wave resonator 12 senses a thermal variation correlated to one of a capacitance variation and a frequency variation of the thermal sensing acoustic wave resonator 12. In some embodiments, the acoustic wave device 11 and the thermal sensing acoustic wave resonator 12 may be formed on a first substrate 10 (as shown in FIG. 1A). In some other embodiments, the acoustic wave device 11 may be formed on a first substrate 10 while the thermal sensing acoustic wave resonator 12 may be formed on a second substrate 13 (as shown in FIG. 1D). In some embodiments, the acoustic wave device 11 may be formed on a first substrate 10 while the thermal sensing acoustic wave resonator 12 may be formed on a second substrate 13, wherein the first substrate 10 and the second substrate 13 are stacked with each other, wherein each of at least one metal pillars 14 are formed on one of the first substrate 10 and the second substrate 13 and connected with the other (as shown in FIG. 1E).

Figure 1H:
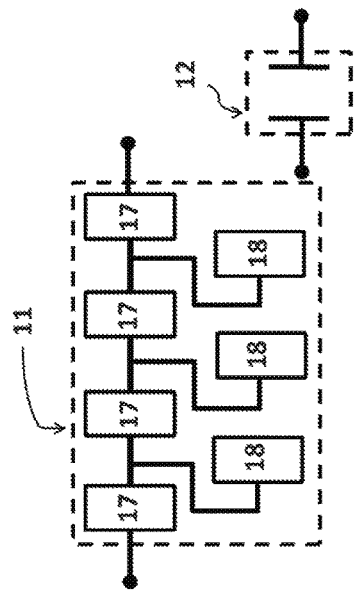

Please refer to FIG. 1H, which shows the schematic view of an embodiment of a thermal sensing acoustic wave resonator integrated with acoustic wave device of the present invention. In current embodiment, the acoustic wave device 11 is an acoustic wave filter. The acoustic wave filter comprises four series acoustic wave resonators 17 and three shunt acoustic wave resonators 18. Each of the series acoustic wave resonators 17 and the shunt acoustic wave resonators 18 is one of a bulk acoustic wave resonator and a thin film bulk acoustic wave resonator. That is that the four series acoustic wave resonators 17 and the three shunt acoustic wave resonators 18 are the same type of acoustic wave resonators of (i) bulk acoustic wave resonators, or (ii) thin film bulk acoustic wave resonators. The four series acoustic wave resonators 17 are connected in series. Each of the three shunt acoustic wave resonators 18 is connected to a junction between two adjacent series acoustic wave resonators 17. The thermal sensing acoustic wave resonator 12 is a bulk acoustic wave resonator or a thin film bulk acoustic wave resonator, that is, the second type of the thermal sensing acoustic wave resonator 12. The thermal sensing acoustic wave resonator 12 senses a thermal variation correlated to one of a capacitance variation and a frequency variation of the thermal sensing acoustic wave resonator 12. In some embodiments, the acoustic wave device 11 and the thermal sensing acoustic wave resonator 12 may be formed on a first substrate 10 (as shown in FIG. 1A). In some other embodiments, the acoustic wave device 11 may be formed on a first substrate 10 while the thermal sensing acoustic wave resonator 12 may be formed on a second substrate 13 (as shown in FIG. 1D). In some embodiments, the acoustic wave device 11 may be formed on a first substrate 10 while the thermal sensing acoustic wave resonator 12 may be formed on a second substrate 13, wherein the first substrate 10 and the second substrate 13 are stacked with each other, wherein each of at least one metal pillars 14 are formed on one of the first substrate 10 and the second substrate 13 and connected with the other (as shown in FIG. 1E).

In some embodiments, the three types of the thermal sensing acoustic wave resonator 12 of the present invention may play dual roles of thermal sensing and acoustic wave filtering. Some embodiments are shown in FIGS. 1I, 1J, 4B~4D, 5A~5E and 5I~5L.

Please refer to FIG. 1I, which shows the schematic view of an embodiment of a thermal sensing acoustic wave resonator integrated with acoustic wave device of the present invention. In current embodiment, the acoustic wave device 11 comprises an acoustic wave filter. The acoustic wave filter comprises four series acoustic wave resonators 17, two shunt acoustic wave resonators 18 and a thermal sensing acoustic wave resonator 12. Each of the series acoustic wave resonators 17, the shunt acoustic wave resonators 18 and the thermal sensing acoustic wave resonator 12 is one of a surface acoustic wave resonator, a bulk acoustic wave resonator and a thin film bulk acoustic wave resonator. That is that the four series acoustic wave resonators 17, the two shunt acoustic wave resonators 18 and the thermal sensing acoustic wave resonator 12 are the same type of acoustic wave resonators of (i) surface acoustic wave resonators (wherein the thermal sensing acoustic wave resonator 12 is the first type of the thermal sensing acoustic wave resonator 12 of the present invention), (ii) bulk acoustic wave resonators (wherein the thermal sensing acoustic wave resonator 12 is the second type of the thermal sensing acoustic wave resonator 12 of the present invention), or (iii) thin film bulk acoustic wave resonators (wherein the thermal sensing acoustic wave resonator 12 is the second type of the thermal sensing acoustic wave resonator 12 of the present invention). The four series acoustic wave resonators 17, the two shunt acoustic wave resonators 18 and the thermal sensing acoustic wave resonator 12 are formed on a substrate (not shown in the Figure), wherein the material of the substrate is one material selected from the group consisting of glass, $LiTaO_3$, $LiNbO_3$, quartz, Si, GaAs, GaP, sapphire, $Al_2O_3$, InP, SiC, diamond, GaN and AlN. The thermal sensing acoustic wave resonator 12 senses a thermal variation correlated to one of a capacitance variation and a frequency variation of the thermal sensing acoustic wave resonator 12. In current embodiment, the four series acoustic wave resonators 17 are connected in series. Each of the two shunt acoustic wave resonators 18 is connected to a junction between two adjacent series acoustic wave resonators 17. The thermal sensing acoustic wave resonator 12 is connected to a junction between two series acoustic wave resonators 17. The thermal sensing acoustic wave resonator 12 plays a role of a shunt acoustic wave resonator of the acoustic wave filter. Therefore, the thermal sensing acoustic wave resonator 12 may play dual roles of thermal sensing and acoustic wave filtering (a shunt acoustic wave resonator of the acoustic wave filter). In some other embodiments, the thermal sensing acoustic wave resonator 12 and the series acoustic wave resonators 17 are connected in series such that the thermal sensing acoustic wave resonator 12 may plays a role of a series acoustic wave resonator of the acoustic wave filter. Therefore, the thermal sensing acoustic wave resonator 12 may play dual roles of thermal sensing and acoustic wave filtering (a series acoustic wave resonator of the acoustic wave filter).

Please refer to FIG. 1J, which shows the schematic view of an embodiment of a thermal sensing acoustic wave resonator integrated with acoustic wave device of the present invention. In current embodiment, the acoustic wave device 11 is an acoustic wave filter. The acoustic wave filter comprises three series acoustic wave resonators 17, three shunt acoustic wave resonators 18 and a thermal sensing acoustic wave resonator 12. The three series acoustic wave resonators 17 and the three shunt acoustic wave resonators 18 are surface acoustic wave resonators. In current embodiment, the thermal sensing acoustic wave resonator 12 is the third type of the thermal sensing acoustic wave resonator 12. The three series acoustic wave resonators 17, the three shunt acoustic wave resonators 18 and the thermal sensing acoustic wave resonator 12 are formed on a substrate (not shown in the Figure), wherein the material of the substrate is one material selected from the group consisting of glass, $LiTaO_3$, $LiNbO_3$, quartz, Si, GaAs, GaP, sapphire, $Al_2O_3$, InP, SiC, diamond, GaN and AlN. The meandered-shaped reflector (the first meandered-shaped reflector 413 or the second meandered-shaped reflector 414 as shown in FIG. 1B) of the thermal sensing acoustic wave resonator 12 senses a thermal variation correlated to a resistance variation of the meandered-shaped reflector (the first meandered-shaped reflector 413 or the second meandered-shaped reflector 414). In current embodiment, the two interlocking comb-shaped electrodes 411, 412 of the interdigital transducer 410 of the thermal sensing acoustic wave resonator 12 and the three series acoustic wave resonators 17 are connected in series so that the two interlocking comb-shaped electrodes 411, 412 of the interdigital transducer 410 of the thermal sensing acoustic wave resonator 12 plays a role of a series acoustic wave resonator of the acoustic wave filter, wherein each of the three shunt acoustic wave resonators 18 is connected to a junction between two adjacent series acoustic wave resonators 17 or between the thermal sensing acoustic wave resonator 12 and one adjacent series acoustic wave resonators 17. Therefore, the thermal sensing acoustic wave resonator 12 may play dual roles of thermal sensing and acoustic wave filtering (a series acoustic wave resonator of the acoustic wave filter). In some other embodiments, the two interlocking comb-shaped electrodes 411, 412 of the interdigital transducer 410 of the thermal sensing acoustic wave resonator 12 may be connected a junction between two series acoustic wave resonators 17 such that the thermal sensing acoustic wave resonator 12 may plays a role of a shunt acoustic wave resonator of the acoustic wave filter. Therefore, the thermal sensing acoustic wave resonator 12 may play dual roles of thermal sensing and acoustic wave filtering (a shunt acoustic wave resonator of the acoustic wave filter).

An active adjustment circuit 32 comprises at least one input terminal, at least one bias adjustment circuit and at least one output terminal. Please refer to FIGS. 2A~2G which show the schematic views of the embodiments of an active adjustment circuit of the present invention. In these embodiments, the active adjustment circuit 32 comprises an input terminal 21, a bias adjustment circuit 20 and an output terminal 22.

Figure 2A:
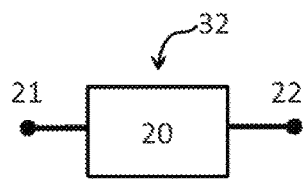
FIGS. 2A~2G are the schematic views of the embodiments of an active adjustment circuit of the present invention.
Figure 2B:
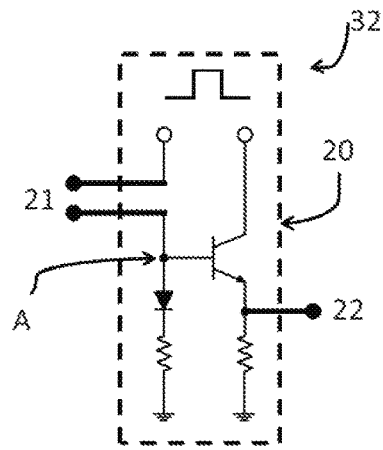
Figure 2C:
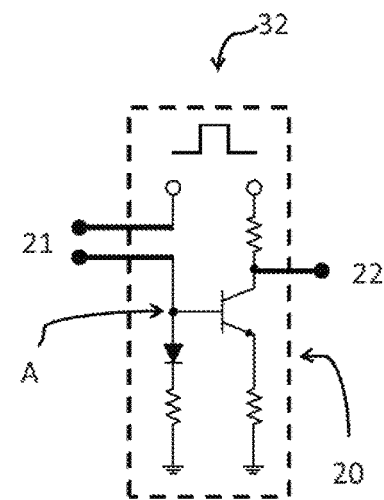
Figure 2D:
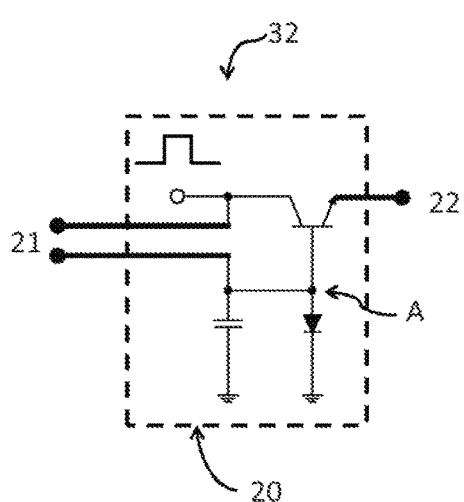

Please refer to FIGS. 2B~2D. The design of active adjustment circuit 32 is suitable for a thermal sensitive resistance sensor as shown in FIG. 6C or the meandered-shaped reflector (the first meandered-shaped reflector 413 or the second meandered-shaped reflector 414) of the third type of the thermal sensing acoustic wave resonator 12 as shown in FIG. 1B. Let the input terminal 21 connect with the thermal sensitive resistance sensor (or the output terminal 415 of the first meandered-shaped reflector 413 or the output terminal 416 of the second meandered-shaped reflector 414). The thermal sensitive resistance sensor (or the first meandered-shaped reflector 413 or the second meandered-shaped reflector 414) senses a thermal variation correlated to a resistance variation of the thermal sensitive resistance sensor (or the output terminal 415 of the first meandered-shaped reflector 413 or the output terminal 416 of the second meandered-shaped reflector 414). The resistance variation of the thermal sensitive resistance sensor (or the first meandered-shaped reflector 413 or the second meandered-shaped reflector 414) causes a voltage variation at Node A. According to the voltage variation at Node A, the bias adjustment circuit 20 adjusts and outputs an active thermal compensating signal through an output terminal 22 of the active adjustment circuit 32. Therefore, the active thermal compensating signal is correlated to the thermal variation.

Figure 2E:
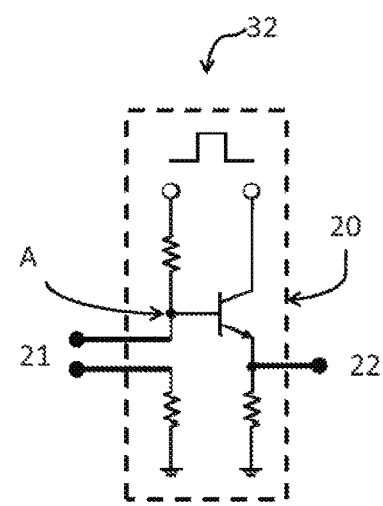
Figure 2F:
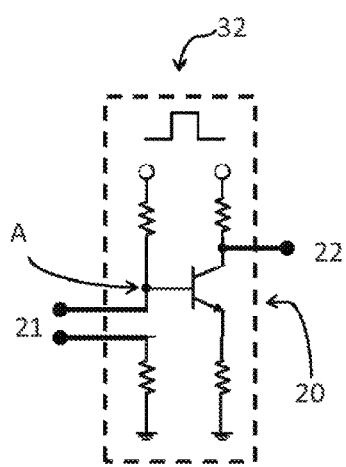
Figure 2G:
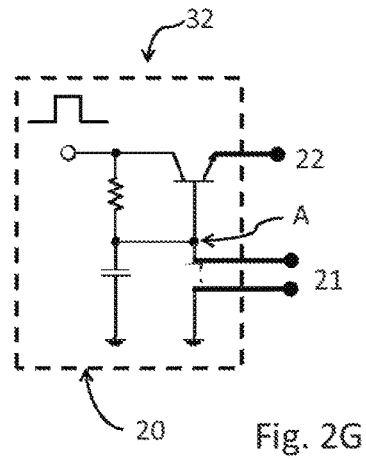
Figure 2H:
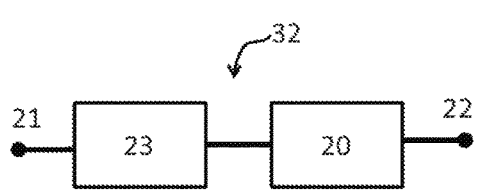
FIGS. 2H~2P are the schematic views of the embodiments of an active adjustment circuit of the present invention.

Please refer to FIGS. 2E~2G. The design of active adjustment circuit 32 is suitable for a thermal sensitive diode sensor. Let the input terminal 21 connect with the thermal sensitive diode sensor. The thermal sensitive diode sensor senses a thermal variation correlated to a variation of a forward voltage of the thermal sensitive diode sensor. The forward voltage of the thermal sensitive diode sensor causes a voltage variation at Node A. According to the voltage variation at Node A, the bias adjustment circuit 20 adjusts and outputs an active thermal compensating signal through an output terminal 22 of the active adjustment circuit 32. Therefore, the active thermal compensating signal is correlated to the thermal variation.

Please refer to FIGS. 2H~2P, which show the schematic views of the embodiments of an active adjustment circuit of the present invention. In these embodiments, the active adjustment circuit 32 comprises an input terminal 21, a bias adjustment circuit 20, a conversion circuit 23 and an output terminal 22. The conversion circuit 23 is electrically connected with the input terminal 21 and the bias adjustment circuit 20. The output terminal 22 is electrically connected with the bias adjustment circuit 20.

Figure 2I:
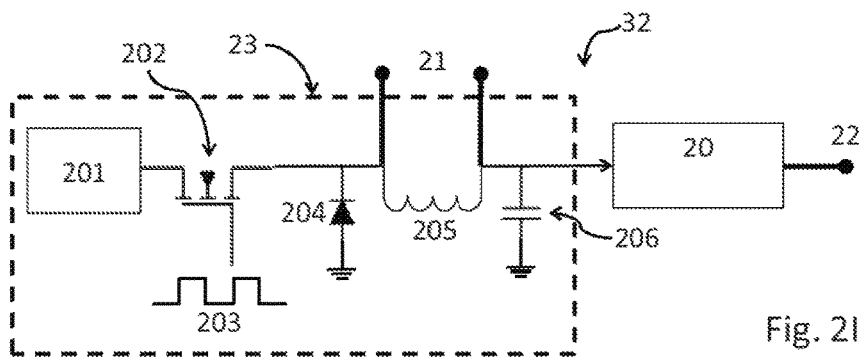

Please refer to FIG. 2I. In current embodiment, the active adjustment circuit 32 is suitable for a thermal sensitive capacitor sensor (or a first type or a second type of the thermal sensing acoustic wave resonator 12, that is, one of a bulk acoustic wave resonator, a thin film bulk acoustic wave resonator and a surface acoustic wave resonator). The conversion circuit 23 is a buck DC-DC converter circuit. An output terminal of the conversion circuit 23 is connected to an input terminal of the bias adjustment circuit 20. The conversion circuit 23 comprises a DC source 201, a switching transistor 202, a pulse generator 203, a diode 204, an inductor 205 and a capacitor 206. A first terminal of the switching transistor 202 is connected to the DC source 201. A second terminal of the switching transistor 202 is connected to a first terminal of the inductor 205 and a cathode terminal of the diode 204. A third terminal of the switching transistor 202 is connected to the pulse generator 203. A second terminal of the inductor 205 is connected to the output terminal of the conversion circuit 23 and a first terminal of the capacitor 206. An anode terminal of the diode 204 and a second terminal of the capacitor 206 are grounded. A thermal sensitive capacitor sensor (or a first type or a second type of the thermal sensing acoustic wave resonator 12) can be connected to the input terminal 21 such that the thermal sensitive capacitor sensor (or a first type or a second type of the thermal sensing acoustic wave resonator 12) is connected in parallel to the inductor 205. The output terminal of the conversion circuit 23 outputs a converted circuit signal to the bias adjustment circuit 20 through the input terminal of the bias adjustment circuit 20. The thermal sensitive capacitor sensor (or a first type or a second type of the thermal sensing acoustic wave resonator 12) senses a thermal variation correlated to a capacitance variation of the thermal sensitive capacitor sensor (or a first type or a second type of the thermal sensing acoustic wave resonator 12). The capacitance variation of the thermal sensitive capacitor sensor (or a first type or a second type of the thermal sensing acoustic wave resonator 12) induces a variation of an internal parasitic capacitance of the inductor 205 causing a variation of an energy stored in the inductor 205. Thereby the variation of the energy stored in the inductor 205 causes a variation of the converted circuit signal; hence the variation of the converted circuit signal is correlated to the thermal variation. The bias adjustment circuit 20 adjusts the converted circuit signal received from the output terminal of the conversion circuit 23 and outputs an active thermal compensating signal through an output terminal 22 of the active adjustment circuit 32. The thermal sensitive capacitor sensor (or a first type or a second type of the thermal sensing acoustic wave resonator 12) may be formed on a substrate, wherein the material of the substrate is one material selected from the group consisting of glass, $LiTaO_3$, $LiNbO_3$, quartz, Si, GaAs, GaP, sapphire, $Al_2O_3$, InP, SiC, diamond, GaN and AlN.

Figure 2J:
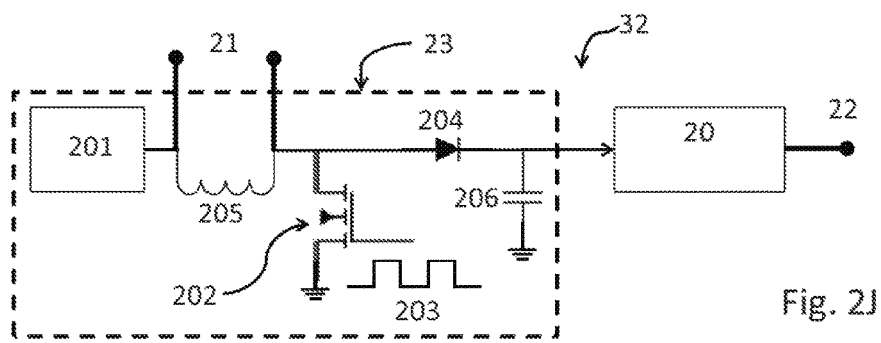

Please refer to FIG. 2J. In current embodiment, the active adjustment circuit 32 is suitable for a thermal sensitive capacitor sensor (or a first type or a second type of the thermal sensing acoustic wave resonator 12, that is, one of a bulk acoustic wave resonator, a thin film bulk acoustic wave resonator and a surface acoustic wave resonator). The conversion circuit 23 is a boost DC-DC converter circuit. An output terminal of the conversion circuit 23 is connected to an input terminal of the bias adjustment circuit 20. The conversion circuit 23 comprises a DC source 201, a switching transistor 202, a pulse generator 203, a diode 204, an inductor 205 and a capacitor 206. A first terminal of the inductor 205 is connected to the DC source 201. A second terminal of the inductor 205 is connected to a first terminal of the switching transistor 202 and an anode terminal of the diode 204. A cathode terminal of the diode 204 is connected to the output terminal of the conversion circuit 23 and a first terminal of the capacitor 206. A second terminal of the switching transistor 202 and a second terminal of the capacitor 206 are grounded. A third terminal of the switching transistor 202 is connected to the pulse generator 203. A thermal sensitive capacitor sensor (or a first type or a second type of the thermal sensing acoustic wave resonator 12, that is, one of a bulk acoustic wave resonator, a thin film bulk acoustic wave resonator and a surface acoustic wave resonator) can be connected to the input terminal 21 such that the thermal sensitive capacitor sensor (or a first type or a second type of the thermal sensing acoustic wave resonator 12) is connected in parallel to the inductor 205. The output terminal of the conversion circuit 23 outputs a converted circuit signal to the bias adjustment circuit 20 through the input terminal of the bias adjustment circuit 20. The thermal sensitive capacitor sensor (or a first type or a second type of the thermal sensing acoustic wave resonator 12) senses a thermal variation correlated to a capacitance variation of the thermal sensitive capacitor sensor (or a first type or a second type of the thermal sensing acoustic wave resonator 12). The capacitance variation of the thermal sensitive capacitor sensor (or a first type or a second type of the thermal sensing acoustic wave resonator 12) induces a variation of an internal parasitic capacitance of the inductor 205 causing a variation of an energy stored in the inductor 205. Thereby the variation of the energy stored in the inductor 205 causes a variation of the converted circuit signal; hence the variation of the converted circuit signal is correlated to the thermal variation. The bias adjustment circuit 20 adjusts the converted circuit signal received from the output terminal of the conversion circuit 23 and outputs an active thermal compensating signal through an output terminal 22 of the active adjustment circuit 32. The thermal sensitive capacitor sensor (or a first type or a second type of the thermal sensing acoustic wave resonator 12) may be formed on a substrate, wherein the material of the substrate is one material selected from the group consisting of glass, $LiTaO_3$, $LiNbO_3$, quartz, Si, GaAs, GaP, sapphire, $Al_2O_3$, InP, SiC, diamond, GaN and AlN.

Figure 2K:
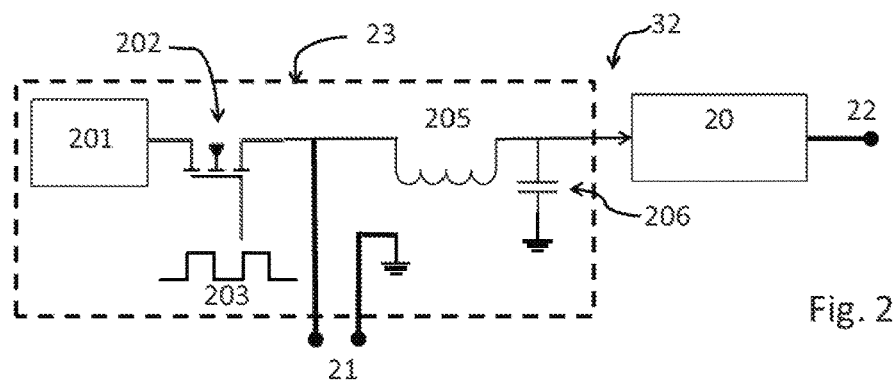

Please refer to FIG. 2K. In current embodiment, the active adjustment circuit 32 is suitable for a thermal sensitive diode sensor. An output terminal of the conversion circuit 23 is connected to an input terminal of the bias adjustment circuit 20. A thermal sensitive diode sensor can be connected to the input terminal 21. The conversion circuit 23 comprises a DC source 201, a switching transistor 202, a pulse generator 203, an inductor 205 and a capacitor 206. A first terminal of the switching transistor 202 is connected to the DC source 201. A second terminal of the switching transistor 202 is connected to a cathode terminal of the thermal sensitive diode sensor and a first terminal of the inductor 205. A third terminal of the switching transistor 202 is connected to the pulse generator 203. A second terminal of the inductor 205 is connected to the output terminal of the conversion circuit 23 and a first terminal of the capacitor 206. An anode terminal of the thermal sensitive diode sensor and a second terminal of the capacitor 206 are grounded. The output terminal of the conversion circuit 23 outputs a converted circuit signal to the bias adjustment circuit 20 through the input terminal of the bias adjustment circuit 20. The thermal sensitive diode sensor senses a thermal variation correlated to a variation of a forward voltage of the thermal sensitive diode sensor. The variation of the forward voltage of the thermal sensitive diode sensor causes a variation of the converted circuit signal; hence the variation of the converted circuit signal is correlated to the thermal variation. The bias adjustment circuit 20 adjusts the converted circuit signal received from the output terminal of the conversion circuit 23 and outputs an active thermal compensating signal through an output terminal 22 of the active adjustment circuit 32. The thermal sensitive diode sensor may be a thermal sensing acoustic wave resonator 12 which is one selected from the group consisting of a bulk acoustic wave resonator, a thin film bulk acoustic wave resonator and a surface acoustic wave resonator. The thermal sensitive diode sensor may be formed on a substrate, wherein the material of the substrate is one material selected from the group consisting of glass, $LiTaO_3$, $LiNbO_3$, quartz, Si, GaAs, GaP, sapphire, $Al_2O_3$, InP, SiC, diamond, GaN and AlN.

Figure 2L:
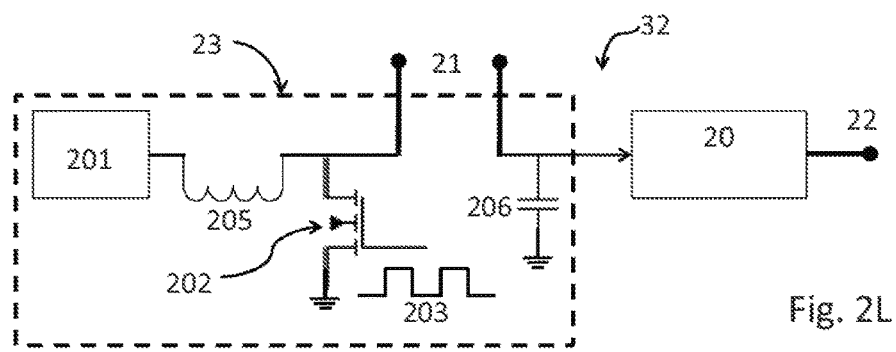

Please refer to FIG. 2L. In current embodiment, the active adjustment circuit 32 is suitable for a thermal sensitive diode sensor. An output terminal of the conversion circuit 23 is connected to an input terminal of the bias adjustment circuit 20. A thermal sensitive diode sensor can be connected to the input terminal 21. The conversion circuit 23 comprises a DC source 201, a switching transistor 202, a pulse generator 203, an inductor 205 and a capacitor 206. A first terminal of the inductor 205 is connected to the DC source 201. A second terminal of the inductor 205 is connected to an anode terminal of the thermal sensitive diode sensor and a second terminal of the switching transistor 202. A third terminal of the switching transistor 203 is connected to the pulse generator 203. A cathode terminal of the thermal sensitive diode sensor is connected to the output terminal of the conversion circuit 23 and a first terminal of the capacitor 206. A first terminal of the switching transistor 202 and a second terminal of the capacitor 206 are grounded. The output terminal of the conversion circuit 23 outputs a converted circuit signal to the bias adjustment circuit 20 through the input terminal of the bias adjustment circuit 20. The thermal sensitive diode sensor senses a thermal variation correlated to a variation of a forward voltage of the thermal sensitive diode sensor. The variation of the forward voltage of the thermal sensitive diode sensor causes a variation of the converted circuit signal; hence the variation of the converted circuit signal is correlated to the thermal variation. The bias adjustment circuit 20 adjusts the converted circuit signal received from the output terminal of the conversion circuit 23 and outputs an active thermal compensating signal through an output terminal 22 of the active adjustment circuit 32. The thermal sensitive diode sensor may be a thermal sensing acoustic wave resonator 12 which is one selected from the group consisting of a bulk acoustic wave resonator, a thin film bulk acoustic wave resonator and a surface acoustic wave resonator. The thermal sensitive diode sensor may be formed on a substrate, wherein the material of the substrate is one material selected from the group consisting of glass, LiTaO$_3$, LiNbO$_3$, quartz, Si, GaAs, GaP, sapphire, Al$_2$O$_3$, InP, SiC, diamond, GaN and AlN.

Figure 2M:
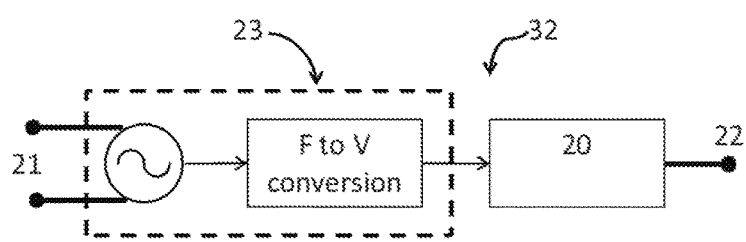
Figure 2N:
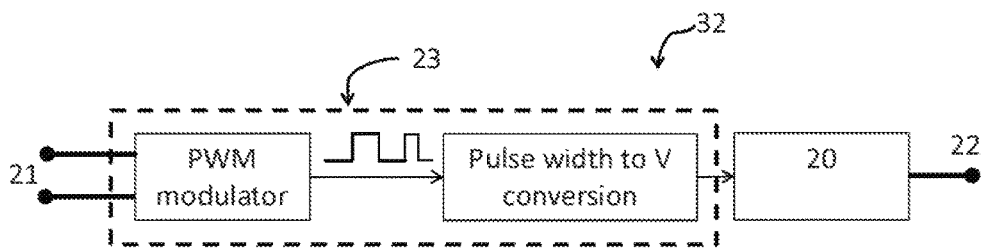

Please refer to FIGS. 2M~2N. The design of active adjustment circuit 32 is suitable for a thermal sensitive resistance, a thermal sensitive diode sensor, the meandered-shaped reflector (the first meandered-shaped reflector 413 or the second meandered-shaped reflector 414) of the third type of the thermal sensing acoustic wave resonator 12 as shown in FIG. 1B, a thermal sensitive capacitor sensor or a first type or a second type of the thermal sensing acoustic wave resonator 12 (that is, one of a bulk acoustic wave resonator, a thin film bulk acoustic wave resonator and a surface acoustic wave resonator). For example, in FIG. 2M; let the input terminal 21 connect with a thermal sensor (a thermal sensitive capacitor sensor or a first type or a second type of the thermal sensing acoustic wave resonator 12). A thermal variation causes a physical property variation (capacitance variation) of the thermal sensor. Therefore, a frequency variation of the pulse generated by the oscillator is caused. After the frequency to voltage conversion circuit, the output voltage variation of the conversion circuit 23 corresponding to the thermal variation is caused. After the adjustment of the bias adjustment circuit 20. The output terminal 22 receives an adjusted output voltage variation which is corresponding to the thermal variation. Similarly, in FIG. 2N, a thermal variation causes a physical property variation (capacitance variation) of the thermal sensor. A pulse width variation of the pulse generated by the PWM modulator is caused. Therefore, the output terminal 22 receives an adjusted output voltage variation which is corresponding to the thermal variation. Let the input terminal 21 connect with a thermal sensor (a thermal sensitive resistance, a thermal sensitive diode sensor, the output terminal 415 of the first meandered-shaped reflector 413 or the output terminal 416 of the second meandered-shaped reflector 414) as shown in FIG. 1B). A thermal variation causes a physical property variation (resistance variation) of the thermal sensor. Therefore, a frequency variation of the pulse generated by the oscillator is caused (FIG. 2M) or a pulse width variation of the pulse generated by the PWM modulator is caused (FIG. 2N). Hence, the output terminal 22 may receive an adjusted output voltage variation which is corresponding to the thermal variation.

Figure 2O:
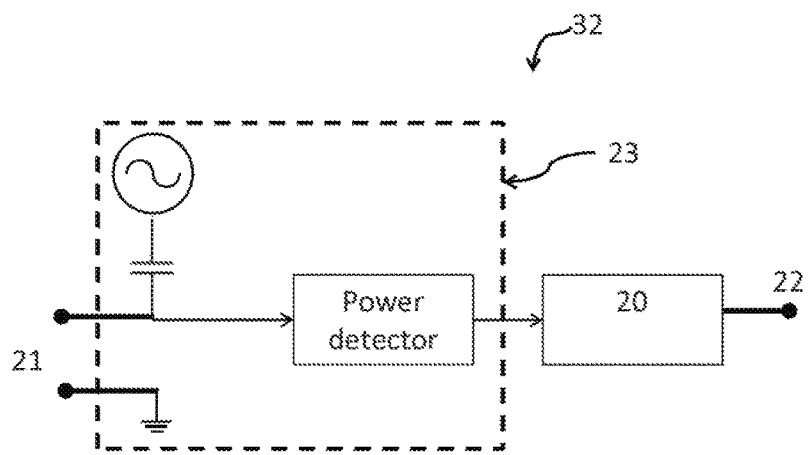

Please refer to FIG. 2O. The design of active adjustment circuit 32 is suitable for a thermal sensor (a thermal sensitive diode sensor, a thermal sensitive capacitor sensor or a first type or a second type of the thermal sensing acoustic wave resonator 12). Let the input terminal 21 connect with the thermal sensor (a thermal sensitive capacitor sensor or a first type or a second type of the thermal sensing acoustic wave resonator 12). A thermal variation causes a physical property variation (capacitance variation) of the thermal sensor. Therefore a voltage variation of the AC signal of the AC source is caused. After the power detector or the rectifier, a DC signal is generated. The DC signal is corresponding to the thermal variation. Hence, after the adjustment of the bias adjustment circuit 20. The output terminal 22 receives an adjusted output voltage variation which is corresponding to the thermal variation.

Figure 2P:
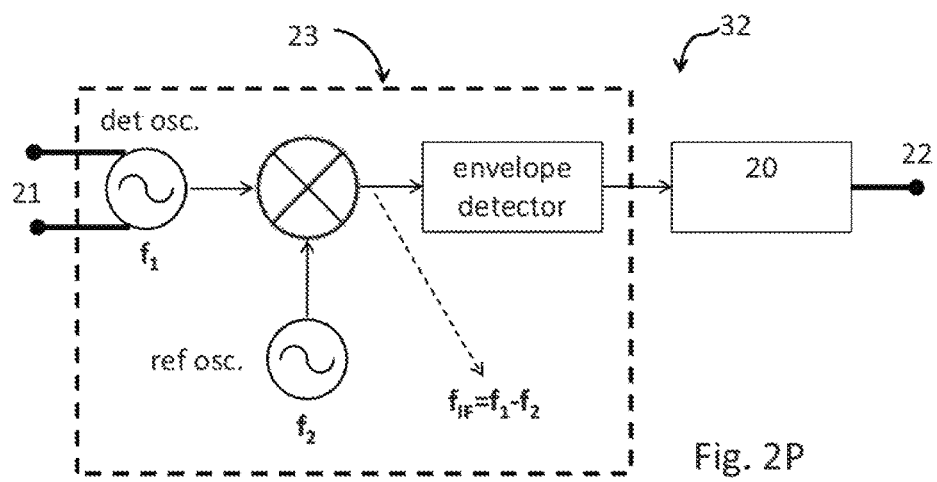
Figure 2Q:
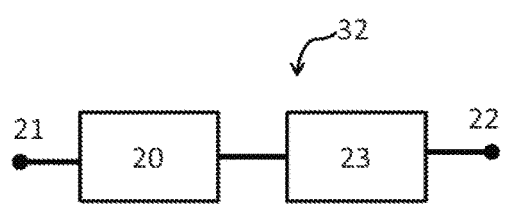

Please refer to FIG. 2P. The design of active adjustment circuit 32 is suitable for a thermal sensor (a thermal sensitive diode sensor, a thermal sensitive capacitor sensor or a first type or a second type of the thermal sensing acoustic wave resonator 12). Let the input terminal 21 connect with the thermal sensor (a thermal sensitive capacitor sensor or a first type or a second type of the thermal sensing acoustic wave resonator 12). After the mixer mixing two pulses generated by the detected oscillator and the referred oscillator, a signal with a frequency is generated by the mixer. The frequency of the signal generated by the mixer is the frequency difference of the frequency of the pulse generated by the detected oscillator and the frequency of the pulse generated by the referred oscillator. A thermal variation causes a physical property variation (capacitance variation) of the thermal sensor. Therefore, a frequency variation of the pulse generated by the detected oscillator is caused. Hence, the frequency of the signal generated by the mixer also causes a frequency variation. After the power detector or the rectifier, a DC signal is generated. The DC signal is corresponding to the thermal variation. Hence, after the adjustment of the bias adjustment circuit 20. The output terminal 22 receives an adjusted output voltage variation which is corresponding to the thermal variation.

Please refer to FIGS. 2Q~2W, which show the schematic views of the embodiments of an active adjustment circuit of the present invention. In these embodiments, the active adjustment circuit 32 comprises an input terminal 21, a bias adjustment circuit 20, a conversion circuit 23 and an output terminal 22. The bias adjustment circuit 20 is electrically connected with the input terminal 21 and the conversion circuit 23. The output terminal 22 is electrically connected with the conversion circuit 23.

Please refer to FIGS. 2R~2T. The design of active adjustment circuit 32 is suitable for a thermal sensor (a thermal sensitive resistance, the first meandered-shaped reflector 413 or the second meandered-shaped reflector 414 of the third type of the thermal sensing acoustic wave resonator 12 as shown in FIG. 1B). Let the input terminal 21 connect with the thermal sensor (a thermal sensitive resistance, the output terminal 415 of the first meandered-shaped reflector 413 or the output terminal 416 of the second meandered-shaped reflector 414 as shown in FIG. 1B). The current $I_1$ is proportional to the current $I_{out}$. Therefore, a thermal variation causes a physical property variation (resistance variation) of the thermal sensor. A current variation of the current $I_1$ is caused and also a current variation of the current $I_{out}$ is caused too. After the current to voltage conversion 23, the output terminal 22 receives an output voltage variation which is corresponding to the thermal variation.

Figure 2W:
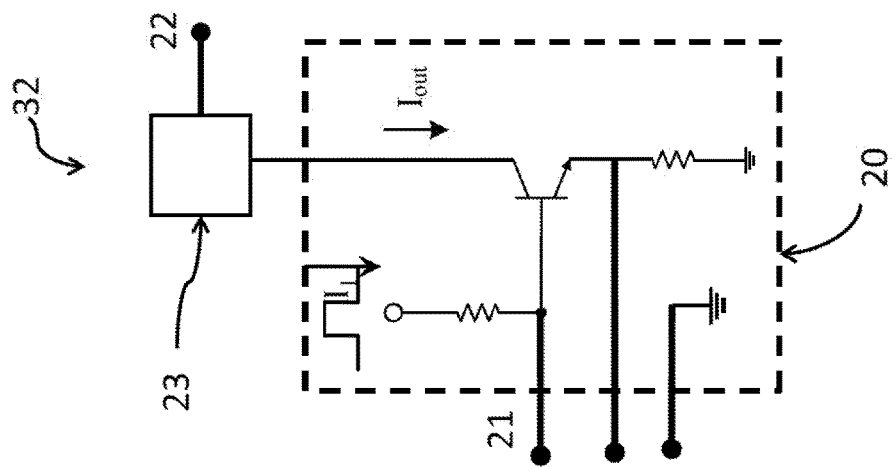
Figure 2V:
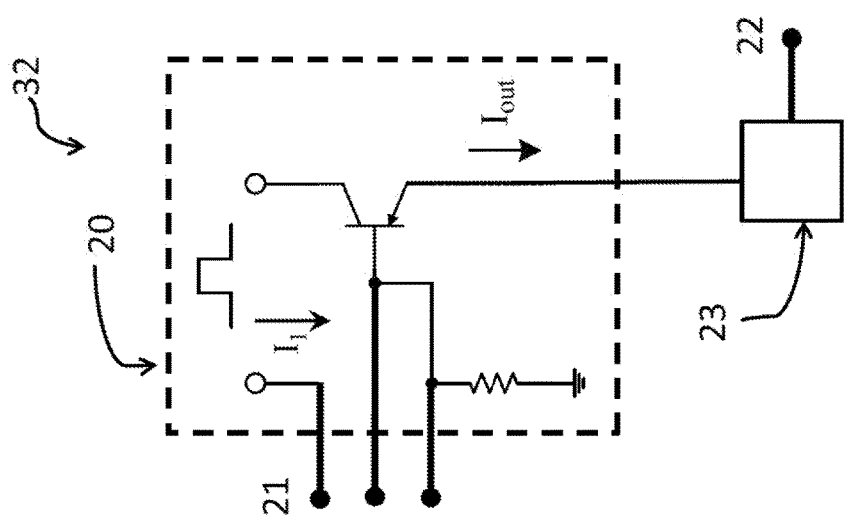

Please refer to FIGS. 2U~2W. The design of active adjustment circuit 32 is suitable for a thermal sensitive transistor sensor. Let the input terminal 21 connect with the thermal sensitive transistor sensor. The current $I_1$ is proportional to the current $I_{out}$. Therefore, a thermal variation causes a physical property variation (voltage variation) of the thermal sensor. A current variation of the current $I_1$ is caused and also a current variation of the current $I_{out}$ is caused too. After the current to voltage conversion 23, the output terminal 22 receives an output voltage variation which is corresponding to the thermal variation.

Please refer to FIGS. 3A~3D, which show the schematic views of the embodiments of an active adjustment circuit of the present invention. In these embodiments, the active adjustment circuit 32 comprises an input terminal 21, a conversion circuit 23, a bias adjustment circuit 20 and an output terminal 22. An input terminal of the conversion circuit 23 is connected to the input terminal 21 of the active adjustment circuit 32. An output of the conversion circuit 23 is connected to an input terminal of the bias adjustment circuit 20. An output terminal of the bias adjustment circuit 20 is connected to the output terminal 22 of the active adjustment circuit 32. The design of the active adjustment circuit 32 (in the embodiments of FIGS. 3A~3D) is suitable for a thermal sensitive resistance sensor or the meandered-shaped reflector (the first meandered-shaped reflector 413 or the second meandered-shaped reflector 414) of the third type of the thermal sensing acoustic wave resonator 12 as shown in FIG. 1B. For example, the input terminal 21 can be connected to one of the output terminal 415 of the first meandered-shaped reflector 413 and the output terminal 416 of the second meandered-shaped reflector 414 of the thermal sensing acoustic wave resonator 12.

Figure 3A:
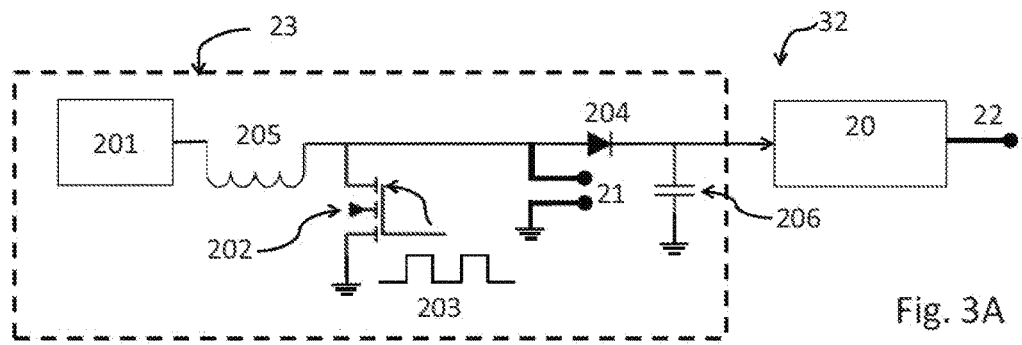
FIGS. 3A~3D are the schematic views of the embodiments of an active adjustment circuit of the present invention.

Please refer to FIG. 3A. The conversion circuit 23 comprises a DC source 201, a switching transistor 202, a pulse generator 203, a diode 204, an inductor 205 and a capacitor 206. A first terminal of the inductor 205 is connected to the DC source 201. A second terminal of the inductor 205 is connected to a first terminal of the switching transistor 202 and an anode terminal of the diode 204. A third terminal of the switching transistor 202 is connected to the pulse generator 203. A cathode terminal of the diode 204 is connected to the output terminal of the conversion circuit 23 and a first terminal of the capacitor 206. A second terminal of the switching transistor 202 and a second terminal of the capacitor 206 are grounded. A thermal sensor (a thermal sensitive resistance sensor or a third type of the thermal sensing acoustic wave resonator 12) can be connected between a ground and a junction of the second terminal of the inductor 205, the first terminal of the switching transistor 202 and the anode terminal of the diode 204. The output terminal of the conversion circuit 23 outputs a converted circuit signal to the bias adjustment circuit 20 through the input terminal of the bias adjustment circuit 20. A variation of the converted circuit signal is correlated to a resistance variation of the thermal sensor (which is correlated to the thermal variation). The bias adjustment circuit 20 adjusts the converted circuit signal received from the output terminal of the conversion circuit 23 and outputs an active thermal compensating signal through an output terminal 22 of the active adjustment circuit 32.

Figure 3B:
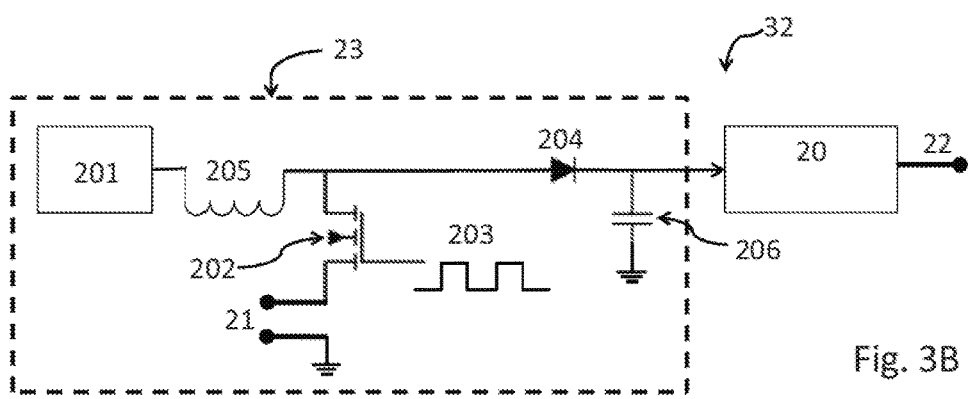

The main structure of the embodiment of FIG. 3B is basically the same as the structure of the embodiment of FIG. 3A, except that the second terminal of the switching transistor 202 is not grounded and the thermal sensor (a thermal sensitive resistance sensor or a third type of the thermal sensing acoustic wave resonator 12) can be connected between the ground and the second terminal of the switching transistor 202.

Figure 3C:
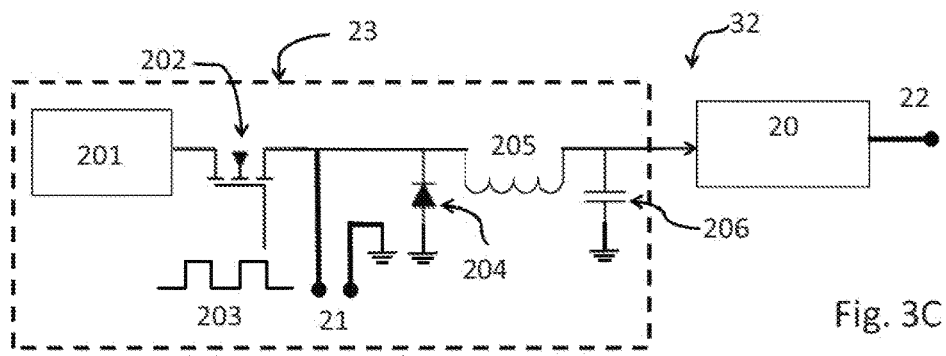

Please refer to FIG. 3C. The conversion circuit 23 comprises a DC source 201, a switching transistor 202, a pulse generator 203, a diode 204, an inductor 205 and a capacitor 206. A first terminal of the switching transistor 202 is connected to the DC source 201. A third terminal of the switching transistor 202 is connected to the pulse generator 203. A second terminal of the switching transistor 202 is connected to a cathode terminal of the diode 204 and a first terminal of the inductor 205. A second terminal of the inductor 205 is connected to the output terminal of the conversion circuit 23 and a first terminal of the capacitor 206. A second terminal of the capacitor 206 and an anode terminal of the diode 204 are grounded. A thermal sensor (a thermal sensitive resistance sensor or a third type of the thermal sensing acoustic wave resonator 12) can be connected between a ground and a junction of the second terminal of the switching transistor 202, the cathode terminal of the diode 204 and the first terminal of the inductor 205. The output terminal of the conversion circuit 23 outputs a converted circuit signal to the bias adjustment circuit 20 through the input terminal of the bias adjustment circuit 20. A variation of the converted circuit signal is correlated to a resistance variation of the thermal sensor (which is correlated to the thermal variation). The bias adjustment circuit 20 adjusts the converted circuit signal received from the output terminal of the conversion circuit 23 and outputs an active thermal compensating signal through an output terminal 22 of the active adjustment circuit 32.

Figure 3D:
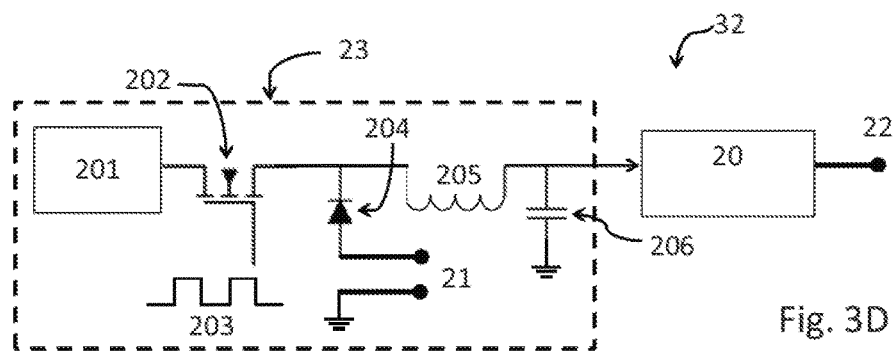

The main structure of the embodiment of FIG. 3D is basically the same as the structure of the embodiment of FIG. 3C, except that the anode terminal of the diode 204 is not grounded and the thermal sensor (a thermal sensitive resistance sensor or a third type of the thermal sensing acoustic wave resonator 12) can be connected between the ground and the anode terminal of the diode 204.

Please refer to FIGS. 3E~3H, which show the schematic views of the embodiments of an active adjustment circuit of the present invention. In these embodiments, the active adjustment circuit 32 comprises input terminals 21, 21', a conversion circuit 23, a bias adjustment circuit 20 and an output terminal 22. An input terminal of the conversion circuit 23 is connected to the input terminal 21 of the active adjustment circuit 32. An output of the conversion circuit 23 is connected to an input terminal of the bias adjustment circuit 20. An output terminal of the bias adjustment circuit 20 is connected to the output terminal 22 of the active adjustment circuit 32. The design of the active adjustment circuit 32 (in the embodiments of FIGS. 3E~3H) is suitable for a thermal sensitive resistance sensor or a third type of the thermal sensing acoustic wave resonator 12. The input terminal 21 can be connected to one of the output terminal 415 of the first meandered-shaped reflector 413 and the output terminal 416 of the second meandered-shaped reflector 414 of the thermal sensing acoustic wave resonator 12, while the input terminal 21' can be connected to the other.

Figure 3E:
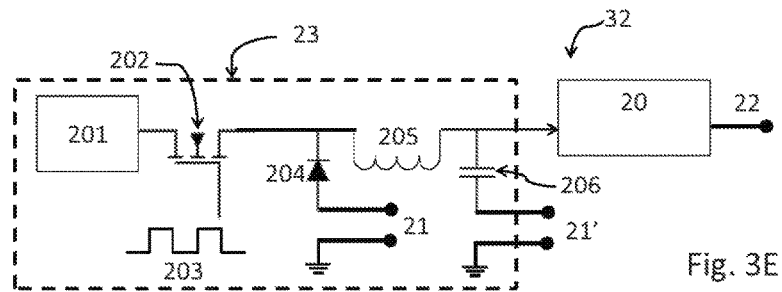
FIGS. 3E~3H are the schematic views of the embodiments of an active adjustment circuit of the present invention.

Please refer to FIG. 3E. The conversion circuit 23 comprises a DC source 201, a switching transistor 202, a pulse generator 203, a diode 204, an inductor 205 and a capacitor 206. A first terminal of the switching transistor 202 is connected to the DC source 201. A third terminal of the switching transistor 202 is connected to the pulse generator 203. A second terminal of the switching transistor 202 is connected to a cathode terminal of the diode 204 and a first terminal of the inductor 205. A second terminal of the inductor 205 is connected to the output terminal of the conversion circuit 23 and a first terminal of the capacitor 206. The input terminal 21 is connected to a ground and an anode terminal of the diode 204. The input terminal 21' is connected to the ground and a second terminal of the capacitor 206. Therefore, a first thermal sensor (a thermal sensitive resistance sensor or a third type of the thermal sensing acoustic wave resonator 12) can be connected to the input terminal 21 and a second thermal sensor (a thermal sensitive resistance sensor or a third type of the thermal sensing acoustic wave resonator 12) can be connected to the input terminal 21'. The output terminal of the conversion circuit 23 outputs a converted circuit signal to the bias adjustment circuit 20 through the input terminal of the bias adjustment circuit 20. A variation of the converted circuit signal is correlated to a resistance variation of the thermal sensor (which is correlated to the thermal variation). The bias adjustment circuit 20 adjusts the converted circuit signal received from the output terminal of the conversion circuit 23 and outputs an active thermal compensating signal through an output terminal 22 of the active adjustment circuit 32.

Figure 3F:
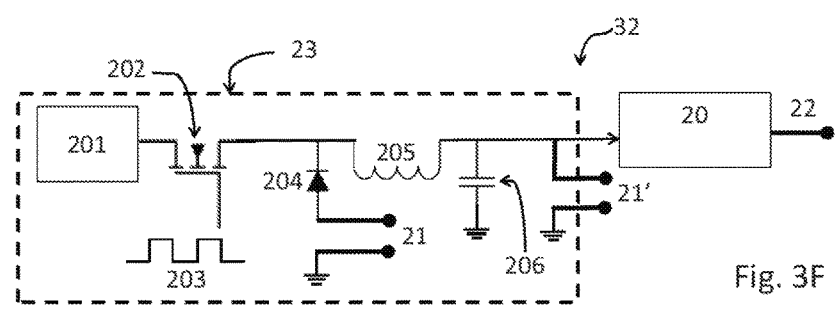

The main structure of the embodiment of FIG. 3F is basically the same as the structure of the embodiment of FIG. 3D, except that the active adjustment circuit 32 further comprises an input terminal 21', the input terminal 21' is connected to the ground and a junction of the second terminal of the inductor 205, the output terminal of the conversion circuit 23 and the second terminal of the capacitor 206. A second thermal sensor (a thermal sensitive resistance sensor or a third type of the thermal sensing acoustic wave resonator 12) can be connected to the input terminal 21'.

Figure 3G:
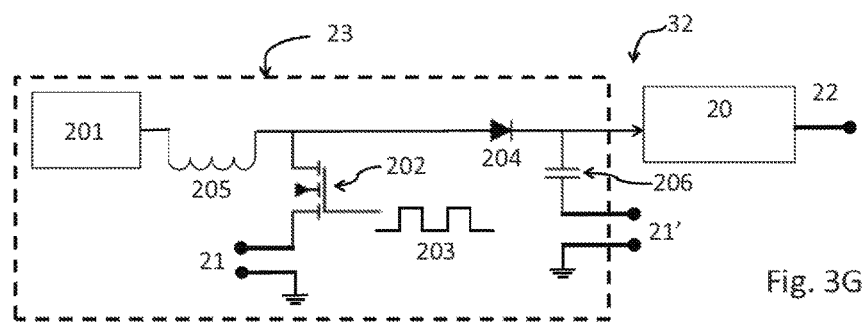

The main structure of the embodiment of FIG. 3G is basically the same as the structure of the embodiment of FIG. 3B, except that the second terminal of the capacitor 206 is not grounded, the active adjustment circuit 32 further comprises an input terminal 21', the input terminal 21' is connected to the ground and the second terminal of the capacitor 206. A second thermal sensor (a thermal sensitive resistance sensor or a third type of the thermal sensing acoustic wave resonator 12 can be connected to the input terminal 21'.

Figure 3H:
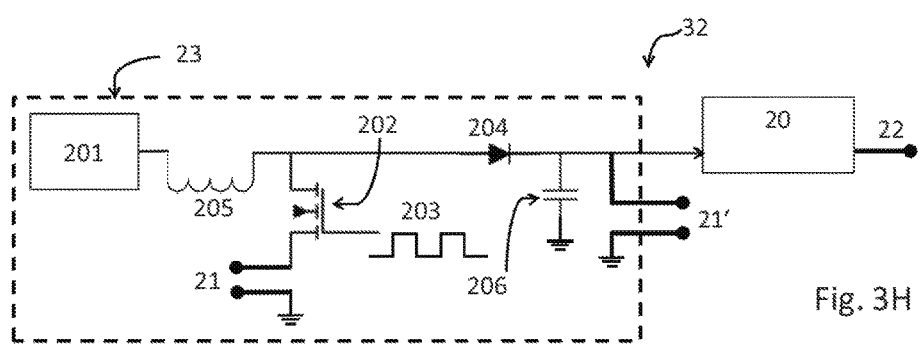

The main structure of the embodiment of FIG. 3H is basically the same as the structure of the embodiment of FIG. 3B, except that the active adjustment circuit 32 further comprises an input terminal 21', the input terminal 21' is connected to the ground and a junction of the cathode terminal of the diode 204, the output terminal of the conversion circuit 23 and the second terminal of the capacitor 206. A second thermal sensor (a thermal sensitive resistance sensor or a third type of the thermal sensing acoustic wave resonator 12) can be connected to the input terminal 21'.

An integrated module of acoustic wave device with active thermal compensation comprises at least one acoustic wave device, at least one thermal sensor, at least one variable reactance device and at least one active adjustment circuit 32. Please refer to FIG. 4A, which shows the schematic view of an embodiment of an integrated module of acoustic wave device with active thermal compensation of the present invention. An integrated module 3 comprises an acoustic wave device 11, a thermal sensor 16(12), a variable reactance device 33 and an active adjustment circuit 32. The thermal sensor 16(12) is connected to the active adjustment circuit 32. The active adjustment circuit 32 is connected to the variable reactance device 33. The variable reactance device 33 is connected to the acoustic wave device 11 (the current embodiment is an application of a thermal sensor integrated with acoustic wave device of the present invention as shown in FIGS. 1A and 1D). In some embodiments, the thermal sensor 16(12) and the acoustic wave device 11 are formed on a first substrate (the same as the structure shown in FIG. 1A), wherein the material of the first substrate is one material selected from the group consisting of glass, LiTaO$_3$, LiNbO$_3$, quartz, Si, GaAs, GaP, sapphire, Al$_2$O$_3$, InP, SiC, diamond, GaN and AlN. In some embodiments, the thermal sensor 16 includes at least one selected from the group consisting of a sensing capacitance variation type thermal sensor, a sensing resistance variation type thermal sensor, a sensing inductance variation type thermal sensor, a sensing current variation type thermal sensor, a sensing voltage variation type thermal sensor and a sensing resonance frequency variation type thermal sensor. In some other embodiments, the thermal sensor 16(12) may be a first type, a second type or a third type of the thermal sensing acoustic wave resonator 12, or a thermal sensitive resistance sensor, a thermal sensitive diode sensor, a thermal sensitive transistor sensor or a thermal sensitive capacitor sensor. The active adjustment circuit 32 of the embodiments shown in FIGS. 2B~2D, 2M, 2N, 2R~2T and 3A~3H are suitable for a thermal sensitive resistance sensor or a third type of the thermal sensing acoustic wave resonator 12 (the first meandered-shaped reflector 413 or the second meandered-shaped reflector 414 as shown in FIG. 1B). The active adjustment circuit 32 of the embodiments shown in FIGS. 2I, 2J and 2M~2P are suitable for a thermal sensitive capacitor sensor, or a first type or a second type of the thermal sensing acoustic wave resonator 12. The active adjustment circuit 32 of the embodiments shown in FIGS. 2E~2G and 2K~2P are suitable for a thermal sensitive diode sensor. The active adjustment circuit 32 of the embodiments shown in FIGS. 2U~2W are suitable for a thermal sensitive transistor sensor. In some embodiments, the acoustic wave device 11 comprises at least one acoustic wave resonator. In some other embodiments, the acoustic wave device 11 comprises at least one acoustic wave filter, wherein each of the at least one acoustic wave filter comprises at least one acoustic wave resonator. In some embodiments, the acoustic wave device 11 comprises at least one acoustic wave duplexer, wherein each of the at least one acoustic wave duplexer comprises at least one acoustic wave filter, wherein each of the at least one acoustic wave filter comprises at least one acoustic wave resonator. In some other embodiments, the acoustic wave device 11 comprises at least one acoustic wave diplexer, wherein each of the at least one acoustic wave diplexer comprises at least one acoustic wave filter, wherein each of the at least one acoustic wave filter comprises at least one acoustic wave resonator. In some embodiments, the variable reactance device 33 may be a variable capacitance device. In some other embodiments, the variable reactance device 33 is a variable capacitance device, wherein the variable capacitance device comprises at least one variable capacitor. In some other embodiments, the variable reactance device 33 is a variable capacitance device, wherein the variable capacitance device comprises at least one varactor. In some embodiments, the variable reactance device 33 may be a variable inductance device. In some other embodiments, the variable reactance device 33 is a variable inductance device, wherein the variable inductance device comprises at least one variable inductor. In some embodiments, the variable reactance device 33 may further include a resistor. In some embodiments, the variable reactance device 33 may be a variable capacitor, a variable inductor, a combination of a variable capacitor and a variable inductor, a combination of a variable capacitor and a resistor, a combination of a variable inductor and a resistor, or a combination of a variable capacitor, a variable inductor and a resistor. In some embodiments, the active adjustment circuit 32 and the variable reactance device 33 are formed on a circuit substrate (not shown in the Figure). In some other embodiments, the acoustic wave device 11, the thermal sensor 16(12), the active adjustment circuit 32 and the variable reactance device 33 are formed on the first substrate.

In some other embodiments, the acoustic wave device 11 is formed on a first substrate, while the thermal sensor 16(12) is formed on a second substrate (the same as the structure shown in FIG. 1D), wherein the material of the first substrate is one material selected from the group consisting of glass, $LiTaO_3$, $LiNbO_3$, quartz, Si, GaAs, GaP, sapphire, $Al_2O_3$, InP, SiC, diamond, GaN and AlN, wherein the material of the second substrate is one material selected from the group consisting of glass, $LiTaO_3$, $LiNbO_3$, quartz, Si, GaAs, GaP, sapphire, $Al_2O_3$, InP, SiC, diamond, GaN and AlN. In some embodiments, the second substrate 13 may be positioned close to the first substrate 10. In some embodiments, the second substrate 13 may be bonded with the first substrate 10. In some embodiments, the acoustic wave device 11, the active adjustment circuit 32 and the variable reactance device 33 are formed on the first substrate, while the thermal sensor 16(12) is formed on the second substrate.

Please refer to FIG. 4B, which shows the schematic view of an embodiment of an integrated module of acoustic wave device with active thermal compensation of the present invention. The main structure is mostly similar to the structure of the embodiment shown in FIG. 4A, except that the acoustic wave device 11 is formed on the first substrate 10 while the thermal sensor 16(12) is formed on a second substrate 13, wherein the second substrate 13 and the first substrate 10 are stacked with each other, wherein each of at least one metal pillars 14 are formed on one of the first substrate 10 and the second substrate 13 and connected with the other (the same as the structure shown in FIG. 1E).

Please refer to FIG. 4C, which shows the schematic view of an embodiment of an integrated module of acoustic wave device with active thermal compensation of the present invention. The main structure is mostly similar to the structure of the embodiment shown in FIG. 4A, except that the thermal sensing acoustic wave resonator 12 is a part of the acoustic wave device 11 (the acoustic wave device 11 comprises the thermal sensing acoustic wave resonator 12) and the thermal sensing acoustic wave resonator 12 plays dual roles of thermal sensing and acoustic wave filtering (similar applications please also refer to the embodiments shown in FIGS. 1I and 1J). The thermal sensing acoustic wave resonator 12 may be a first type, a second type or a third type of the thermal sensing acoustic wave resonator 12.

Please refer to FIG. 4D, which shows the schematic view of an embodiment of an integrated module of acoustic wave device with active thermal compensation of the present invention. The main structure is mostly similar to the structure of the embodiment shown in FIG. 4A, except that it further comprises a power amplifier 34, a low noise amplifier 35 and an antenna 36. The power amplifier 34, the low noise amplifier 35 and the antenna 36 are connected to the acoustic wave device 11. In some embodiments, the power amplifier 34 and the low noise amplifier 35 are formed on an amplifier substrate. In some other embodiments, the active adjustment circuit 32, the variable reactance device 33, the power amplifier 34 and the low noise amplifier 35 are formed on a circuit substrate. In some embodiment, the acoustic wave device 11, the active adjustment circuit 32, the variable reactance device 33, the power amplifier 34 and the low noise amplifier 35 are formed on the first substrate.

Figure 4E:
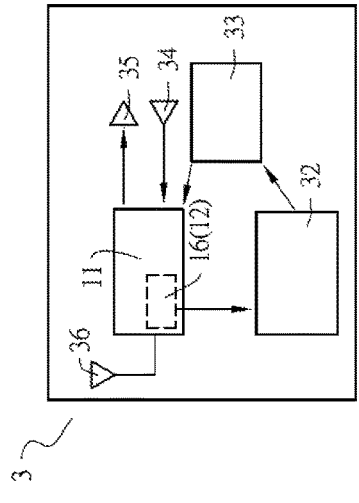

Please refer to FIG. 4E, which shows the schematic view of an embodiment of an integrated module of acoustic wave device with active thermal compensation of the present invention. The main structure is mostly similar to the structure of the embodiment shown in FIG. 4B, except that it further comprises a power amplifier 34 and a low noise amplifier 35. The power amplifier 34 and the low noise amplifier 35 are connected to the acoustic wave device 11. In some embodiments, power amplifier 34 and the low noise amplifier 35 are formed on an amplifier substrate. In some other embodiments, the active adjustment circuit 32, the variable reactance device 33, the power amplifier 34 and the low noise amplifier 35 are formed on a circuit substrate. In some embodiment, the acoustic wave device 11, the active adjustment circuit 32, the variable reactance device 33, the power amplifier 34 and the low noise amplifier 35 are formed on the first substrate.

Figure 4F:
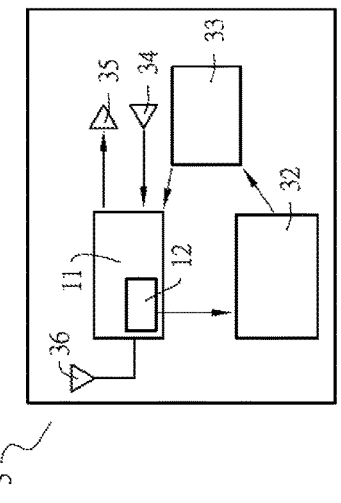

Please refer to FIG. 4F, which shows the schematic view of an embodiment of an integrated module of acoustic wave device with active thermal compensation of the present invention. The main structure is mostly similar to the structure of the embodiment shown in FIG. 4E, except that it further comprises an antenna 36. The antenna 36 is connected to the acoustic wave device 11.

Figure 4G:
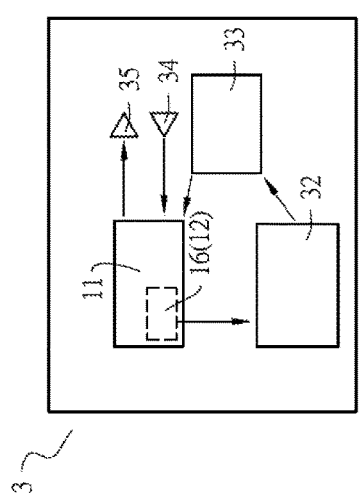

Please refer to FIG. 4G, which shows the schematic view of an embodiment of an integrated module of acoustic wave device with active thermal compensation of the present invention. The main structure is mostly similar to the structure of the embodiment shown in FIG. 4C, except that it further comprises a power amplifier 34 and a low noise amplifier 35. The power amplifier 34 and the low noise amplifier 35 are connected to the acoustic wave device 11. In some embodiments, power amplifier 34 and the low noise amplifier 35 are formed on an amplifier substrate. In some other embodiments, the active adjustment circuit 32, the variable reactance device 33, the power amplifier 34 and the low noise amplifier 35 are formed on a circuit substrate. In some embodiment, the acoustic wave device 11, the active adjustment circuit 32, the variable reactance device 33, the power amplifier 34 and the low noise amplifier 35 are formed on the first substrate.

Figure 4H:
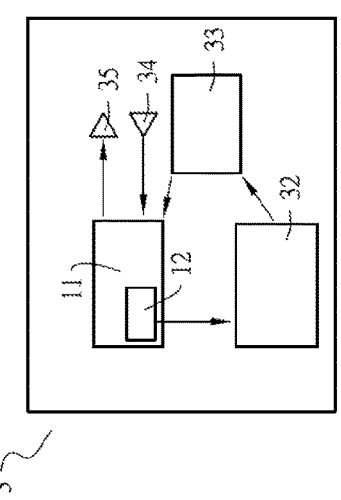

Please refer to FIG. 4H, which shows the schematic view of an embodiment of an integrated module of acoustic wave device with active thermal compensation of the present invention. The main structure is mostly similar to the structure of the embodiment shown in FIG. 4G, except that it further comprises an antenna 36. The antenna 36 is connected to the acoustic wave device 11.

The present invention further provides an active thermal compensating method for an integrated module of acoustic wave device with active thermal compensation. The active thermal compensating method for the embodiments of FIGS. 4A, 4B and 4D~4F comprises following steps of: sensing a thermal variation by a thermal sensor 16(12); and outputting an active thermal compensating signal to the variable reactance device 33 by the active adjustment circuit 32, wherein the active thermal compensating signal is correlated to the thermal variation, wherein the active thermal compensating signal induces a physical property variation of the variable reactance device 33 such that the physical property variation of the variable reactance device 33 compensates the impact of the thermal variation to the acoustic wave device 11. The active thermal compensating method for the embodiments of FIGS. 4C, 4G and 4H comprises following steps of: sensing a thermal variation by a thermal sensing acoustic wave resonator 12; and outputting an active thermal compensating signal to the variable reactance device 33 by the active adjustment circuit 32, wherein the active thermal compensating signal is correlated to the thermal variation, wherein the active thermal compensating signal induces a physical property variation of the variable reactance device 33 such that the physical property variation of the variable reactance device 33 compensates the impact of the thermal variation to the acoustic wave device 11. In some embodiments, the physical property variation includes at least one selected from the group consisting of a capacitance variation, a resistance variation, an inductance variation, a current variation and a voltage variation and a resonance frequency variation.

Figure 5A:
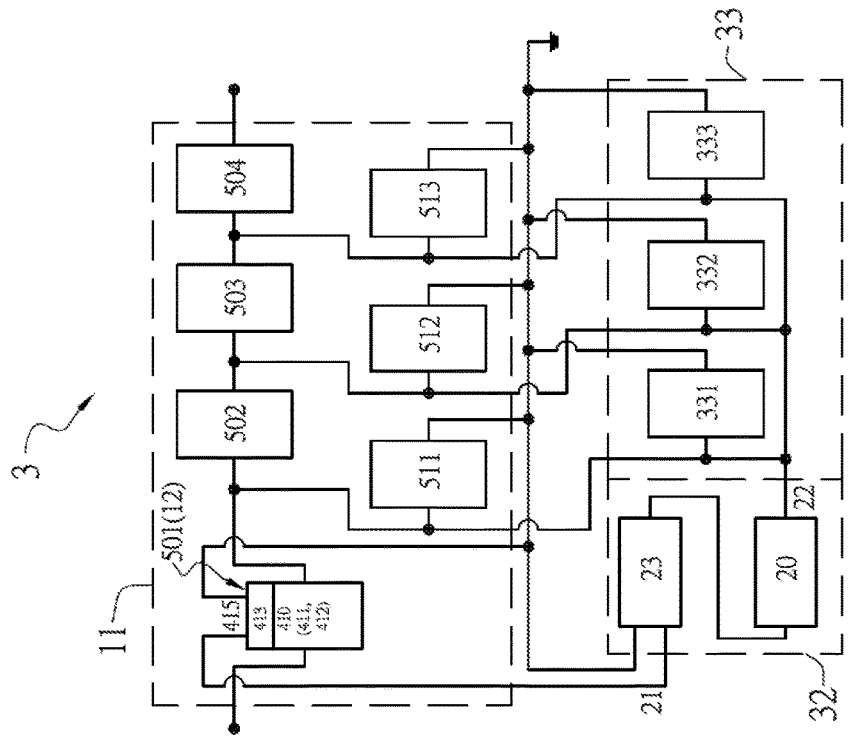

Please refer to FIG. 5A, which shows the schematic view of an embodiment of an integrated module of acoustic wave device with active thermal compensation of the present invention (the current embodiment is an application of the embodiment of FIG. 4C). The main structure of the integrated module 3 comprises an acoustic wave device 11, an active adjustment circuit 32 and a variable reactance device 33. The acoustic wave device 11 is formed on a substrate, wherein the material of the substrate is one material selected from the group consisting of glass, LiTaO$_3$, LiNbO$_3$, quartz, Si, GaAs, GaP, sapphire, Al$_2$O$_3$, InP, SiC, diamond, GaN and AlN. In current embodiment, the acoustic wave device 11 is an acoustic wave filter. The acoustic wave filter comprises a thermal sensing acoustic wave resonator 501(12), first acoustic wave resonators 502, 503 and 504 and second acoustic wave resonators 511, 512 and 513. The first acoustic wave resonators 502, 503 and 504 are series acoustic wave resonators of the acoustic wave filter. The second acoustic wave resonators 511, 512 and 513 are shunt acoustic wave resonators of the acoustic wave filter. The thermal sensing acoustic wave resonator 501(12) is a third type of the thermal sensing acoustic wave resonator 12. The thermal sensing acoustic wave resonator 501(12) comprises a first meandered-shaped reflector 413 (which plays a role of thermal sensing), a second meandered-shaped reflector 414 (which plays a role of thermal sensing) and two interlocking comb-shaped electrodes 411, 412 of an interdigital transducer 410. The two meandered-shaped reflectors 413, 414 are formed respectively at two sides of the two interlocking comb-shaped electrodes 411, 412 of the interdigital transducer 410. The thermal sensing acoustic wave resonator 501(12) further comprises an output terminal 415 of the first meandered-shaped reflector 413 and an output terminal 416 of the second meandered-shaped reflector 414. In current embodiment, the thermal sensing acoustic wave resonator 501(12) is a thermal sensor and also a series acoustic wave resonator of the acoustic wave filter. The thermal sensing acoustic wave resonator 501(12) plays dual roles of thermal sensing and acoustic wave filtering. The thermal sensing acoustic wave resonator 501(12) senses a thermal variation correlated to a resistance variation of the thermal sensing acoustic wave resonator 501(12). The second acoustic wave resonators 511, 512 and 513, and the first acoustic wave resonators 502, 503 and 504 are surface acoustic wave resonators. The thermal sensing acoustic wave resonator 501(12) and the three first acoustic wave resonators 502, 503 and 504 are connected in series. Two terminals of the second acoustic wave resonator 511 are connected respectively to a ground and a junction between the thermal sensing acoustic wave resonator 501(12) and the first acoustic wave resonator 502. Two terminals of the second acoustic wave resonator 512 are connected respectively to the ground and a junction between the first acoustic wave resonators 502 and 503. Two terminals of the second acoustic wave resonator 513 are connected respectively to the ground and a junction between the first acoustic wave resonators 503 and 504. The active adjustment circuit 32 comprises input terminals 21, 21', a conversion circuit 23, a bias adjustment circuit 20 and an output terminal 22. The input terminal 21 and the input terminal 21' are connected to the conversion circuit 23. An output terminal of the conversion circuit 23 is connected to an input terminal of the bias adjustment circuit 20. The bias adjustment circuit 20 is connected to the output terminal 22. The active adjustment circuit 32 may be one of the active adjustment circuits 32 shown in FIGS. 3E~3H. The output terminal 415 of the first meandered-shaped reflector 413 of the thermal sensing acoustic wave resonator 501(12) is connected in parallel to the input terminal 21 of the active adjustment circuit 32. The output terminal 416 of the second meandered-shaped reflector 414 of the thermal sensing acoustic wave resonator 501(12) is connected in parallel to the input terminal 21' of the active adjustment circuit 32. In current embodiment, the variable reactance device 33 is a variable capacitance device, wherein the variable capacitance device comprises a varactor 331, a varactor 332 and a varactor 333. The varactor 331 comprises a varactor input terminal connected to the output terminal 22 of the active adjustment circuit 32, and the varactor 331 is connected in parallel to the shunt acoustic wave resonator 511. The varactor 332 comprises a varactor input terminal connected to the output terminal 22 of the active adjustment circuit 32, and the varactor 332 is connected in parallel to the shunt acoustic wave resonator 512. The varactor 333 comprises a varactor input terminal connected to the output terminal 22 of the active adjustment circuit 32, and the varactor 333 is connected in parallel to the shunt acoustic wave resonator 513. Each of the varactor 331, the varactor 332 and the varactor 333 receives respectively an active thermal compensating signal from the active adjustment circuit 32, wherein the active thermal compensating signal is correlated to the thermal variation. And the active thermal compensating signal induces a varactor capacitance variation of each of the varactor 331, the varactor 332 and the varactor 333 such that the varactor capacitance variation of each of the varactor 331, the varactor 332 and the varactor 333 compensates the impact of the thermal variation to the acoustic wave device 11. In some embodiments, the active adjustment circuit 32 and the variable reactance device 33 are formed on a circuit substrate (not shown in the Figure). In some other embodiments, the acoustic wave device 11, the thermal sensing acoustic wave resonator 501(12), the active adjustment circuit 32 and the variable reactance device 33 are formed on the same substrate. In some embodiments, the location of the thermal sensing acoustic wave resonator 501(12) may be interchanged with any one of the three first acoustic wave resonators 502, 503 and 504. For example, in some embodiments, the location of the thermal sensing acoustic wave resonator 501(12) is interchanged with the first acoustic wave resonator 503. Therefore, the new order becomes: the first acoustic wave resonator 503, the first acoustic wave resonator 502, the thermal sensing acoustic wave resonator 501(12), the first acoustic wave resonator 504.

Figure 5B:
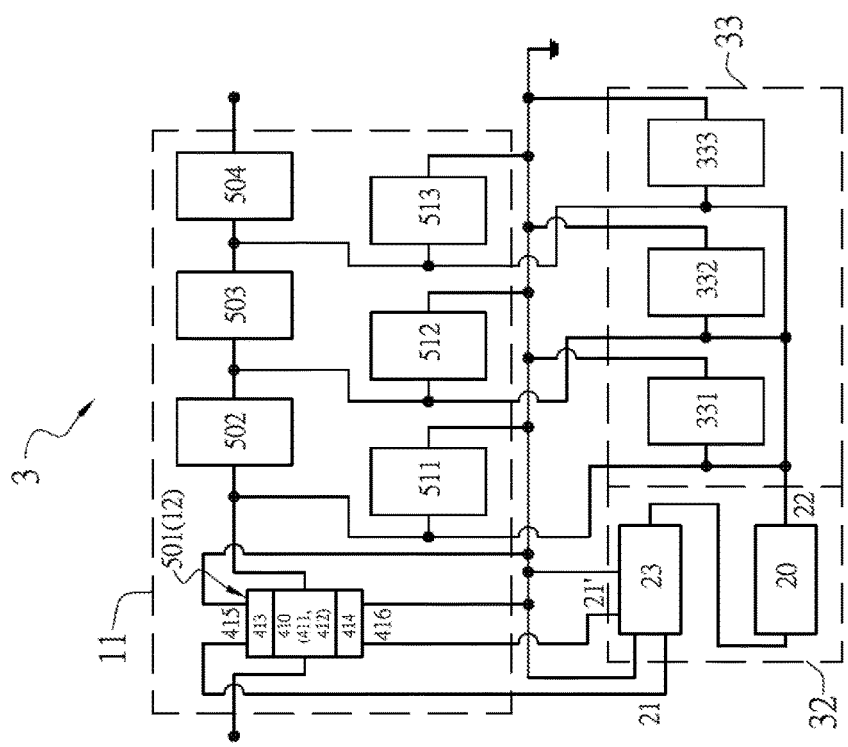

Please refer to FIG. 5B, which shows the schematic view of an embodiment of an integrated module of acoustic wave device with active thermal compensation of the present invention (the current embodiment is an application of the embodiment of FIG. 4C). The main structure of the embodiment of FIG. 5B is basically the same as the structure of the embodiment of FIG. 5A, except that the thermal sensing acoustic wave resonator 501(12) does not comprises the second meandered-shaped reflector 414 and the output terminal 416 and the active adjustment circuit 32 does not comprises the output terminal 22'. The active adjustment circuit 32 may be one of the active adjustment circuits 32 shown in FIGS. 3A~3H. In some other embodiments, the active adjustment circuit 32 may be one of the active adjustment circuits 32 shown in FIGS. 2M, 2N and 2R~2T.

Please refer to FIG. 5C, which shows the schematic view of an embodiment of an integrated module of acoustic wave device with active thermal compensation of the present invention (the current embodiment is an application of the embodiment of FIG. 4C). The main structure of the integrated module 3 comprises an acoustic wave device 11, an active adjustment circuit 32 and a variable reactance device 33. The acoustic wave device 11 is formed on a substrate, wherein the material of the substrate is one material selected from the group consisting of glass, LiTaO$_3$, LiNbO$_3$, quartz, Si, GaAs, GaP, sapphire, Al$_2$O$_3$, InP, SiC, diamond, GaN and AlN. In current embodiment, the acoustic wave device 11 is an acoustic wave filter. The acoustic wave filter comprises a thermal sensing acoustic wave resonator 511(12), first acoustic wave resonators 501, 502, 503 and 504 and second acoustic wave resonators 512 and 513. The first acoustic wave resonators 501, 502, 503 and 504 are series acoustic wave resonators of the acoustic wave filter. The second acoustic wave resonators 512 and 513 are shunt acoustic wave resonators of the acoustic wave filter. The thermal sensing acoustic wave resonator 511(12) is a third type of the thermal sensing acoustic wave resonator 12. The thermal sensing acoustic wave resonator 511(12) comprises a first meandered-shaped reflector 413 (which plays a role of thermal sensing), a second meandered-shaped reflector 414 (which plays a role of thermal sensing) and two interlocking comb-shaped electrodes 411, 412 of an interdigital transducer 410. The two meandered-shaped reflectors 413, 414 are formed respectively at two sides of the two interlocking comb-shaped electrodes 411, 412 of the interdigital transducer 410. The thermal sensing acoustic wave resonator 511(12) further comprises an output terminal 415 of the first meandered-shaped reflector 413 and an output terminal 416 of the second meandered-shaped reflector 414. In current embodiment, the thermal sensing acoustic wave resonator 511(12) is a thermal sensor and also a shunt acoustic wave resonator of the acoustic wave filter. The thermal sensing acoustic wave resonator 511(12) plays dual roles of thermal sensing and acoustic wave filtering. The thermal sensing acoustic wave resonator 511(12) senses a thermal variation correlated to a resistance variation of the thermal sensing acoustic wave resonator 511(12). The second acoustic wave resonators 512 and 513, and the first acoustic wave resonators 501, 502, 503 and 504 are surface acoustic wave resonators. The thermal sensing acoustic wave resonator 511(12) and the four first acoustic wave resonators 501, 502, 503 and 504 are connected in series. Two terminals of the thermal sensing acoustic wave resonator 511(12) are connected respectively to a ground and a junction between the first acoustic wave resonators 501 and 502. Two terminals of the second acoustic wave resonator 512 are connected respectively to the ground and a junction between the first acoustic wave resonators 502 and 503. Two terminals of the second acoustic wave resonator 513 are connected respectively to the ground and a junction between the first acoustic wave resonators 503 and 504. The active adjustment circuit 32 comprises input terminals 21, 21', a conversion circuit 23, a bias adjustment circuit 20 and an output terminal 22. The input terminal 21 and the input terminal 21' are connected to the conversion circuit 23. An output terminal of the conversion circuit 23 is connected to an input terminal of the bias adjustment circuit 20. The bias adjustment circuit 20 is connected to the output terminal 22. The active adjustment circuit 32 may be one of the active adjustment circuits 32 shown in FIGS. 3E~3H. The output terminal 415 of the first meandered-shaped reflector 413 of the thermal sensing acoustic wave resonator 511(12) is connected in parallel to the input terminal 21 of the active adjustment circuit 32. The output terminal 416 of the second meandered-shaped reflector 414 of the thermal sensing acoustic wave resonator 511(12) is connected in parallel to the input terminal 21' of the active adjustment circuit 32. In current embodiment, the variable reactance device 33 is a variable capacitance device, wherein the variable capacitance device comprises a varactor 331, a varactor 332 and a varactor 333. The varactor 331 comprises a varactor input terminal connected to the output terminal 22 of the active adjustment circuit 32, and the varactor 331 is connected in parallel to the shunt acoustic wave resonator 511(12). The varactor 332 comprises a varactor input terminal connected to the output terminal 22 of the active adjustment circuit 32, and the varactor 332 is connected in parallel to the shunt acoustic wave resonator 512. The varactor 333 comprises a varactor input terminal connected to the output terminal 22 of the active adjustment circuit 32, and the varactor 333 is connected in parallel to the shunt acoustic wave resonator 513. Each of the varactor 331, the varactor 332 and the varactor 333 receives respectively an active thermal compensating signal from the active adjustment circuit 32, wherein the active thermal compensating signal is correlated to the thermal variation. And the active thermal compensating signal induces a varactor capacitance variation of each of the varactor 331, the varactor 332 and the varactor 333 such that the varactor capacitance variation of each of the varactor 331, the varactor 332 and the varactor 333 compensates the impact of the thermal variation to the acoustic wave device 11. In some embodiments, the location of the thermal sensing acoustic wave resonator 511(12) may be interchanged with any one of the two shunt acoustic wave resonators 512 and 513. For example, in some embodiments, the location of the thermal sensing acoustic wave resonator 511(12) is interchanged with the shunt acoustic wave resonator 513. Therefore, the new order becomes: the shunt acoustic wave resonator 513, the shunt acoustic wave resonator 512, the thermal sensing acoustic wave resonator 511(12).

Please refer to FIG. 5D, which shows the schematic view of an embodiment of an integrated module of acoustic wave device with active thermal compensation of the present invention (the current embodiment is also an application of the embodiment of FIG. 4C). The main structure of the embodiment of FIG. 5D is basically the same as the structure of the embodiment of FIG. 5C, except that the thermal sensing acoustic wave resonator 511(12) does not comprises the second meandered-shaped reflector 414 and the output terminal 416 and the active adjustment circuit 32 does not comprises the output terminal 22'. The active adjustment circuit 32 may be one of the active adjustment circuits 32 shown in FIGS. 3A~3H.

Figure 5F:
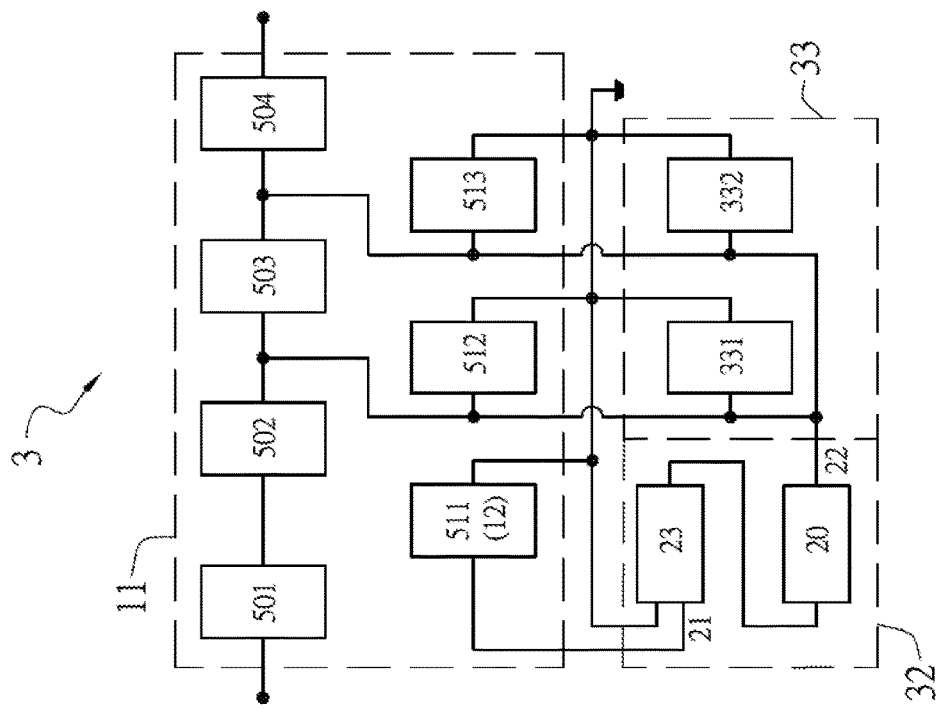
FIGS. 5E~5H are the schematic views of the embodiments of an integrated module of acoustic wave device with active thermal compensation of the present invention.
Figure 5E:
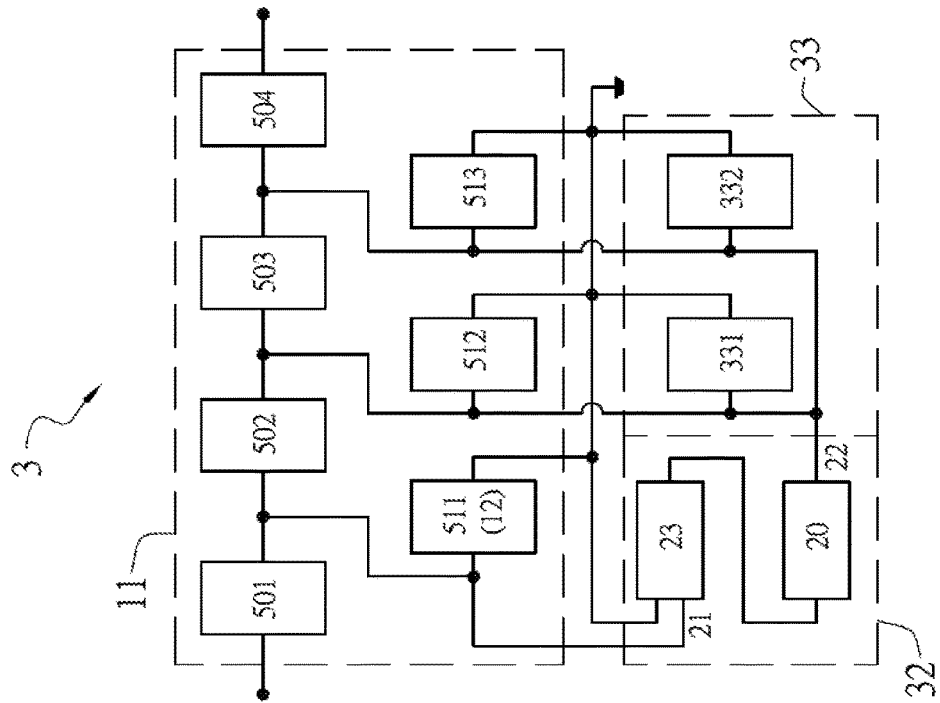

Please refer to FIG. 5E, which shows the schematic view of an embodiment of an integrated module of acoustic wave device with active thermal compensation of the present invention (the current embodiment is an application of the embodiment of FIG. 4C). The main structure of the integrated module 3 comprises an acoustic wave device 11, an active adjustment circuit 32 and a variable reactance device 33. The acoustic wave device 11 is formed on a substrate, wherein the material of the substrate is one material selected from the group consisting of glass, $LiTaO_3$, $LiNbO_3$, quartz, Si, GaAs, GaP, sapphire, $Al_2O_3$, InP, SiC, diamond, GaN and AlN. In current embodiment, the acoustic wave device 11 is an acoustic wave filter. The acoustic wave filter comprises a thermal sensing acoustic wave resonator 511(12), second acoustic wave resonators 512 and 513, and first acoustic wave resonators 501, 502, 503 and 504. The first acoustic wave resonators 501, 502, 503 and 504 are series acoustic wave resonators of the acoustic wave filter. The second acoustic wave resonators 512 and 513 are shunt acoustic wave resonators of the acoustic wave filter. In current embodiment, the thermal sensing acoustic wave resonator 511(12) is a thermal sensor and also a shunt acoustic wave resonator of the acoustic wave filter. The thermal sensing acoustic wave resonator 511(12) plays dual roles of thermal sensing and acoustic wave filtering. The thermal sensing acoustic wave resonator 511(12) senses a thermal variation correlated to a capacitance variation of the thermal sensing acoustic wave resonator 511(12). The thermal sensing acoustic wave resonator 511(12), the second acoustic wave resonators 512 and 513, and the first acoustic wave resonators 501, 502, 503 and 504 may be surface acoustic wave resonators, bulk acoustic wave resonators or thin film bulk acoustic wave resonators. The four first acoustic wave resonators 501, 502, 503 and 504 are connected in series. Two terminals of the thermal sensing acoustic wave resonator 511(12) are connected respectively to a ground and a junction between the first acoustic wave resonators 501 and 502. Two terminals of the second acoustic wave resonator 512 are connected respectively to the ground and a junction between the first acoustic wave resonators 502 and 503. Two terminals of the second acoustic wave resonator 513 are connected respectively to the ground and a junction between the first acoustic wave resonators 503 and 504. The active adjustment circuit 32 comprises an input terminal 21, a conversion circuit 23, a bias adjustment circuit 20 and an output terminal 22. The input terminal 21 is connected to the conversion circuit 23. An output terminal of the conversion circuit 23 is connected to an input terminal of the bias adjustment circuit 20. The bias adjustment circuit 20 is connected to the output terminal 22. In some embodiments, the active adjustment circuit 32 may be one of the active adjustment circuits 32 shown in FIGS. 2I and 2J. In some other embodiments, the active adjustment circuit 32 may be one of the active adjustment circuits 32 shown in FIGS. 2M~2P. The thermal sensing acoustic wave resonator 511(12) is connected in parallel to the input terminal 21 of the active adjustment circuit 32. In current embodiment, the variable reactance device 33 is a variable capacitance device, wherein the variable capacitance device comprises a varactor 331 and a varactor 332. The varactor 331 comprises a varactor input terminal connected to the output terminal 22 of the active adjustment circuit 32, and the varactor 331 is connected in parallel to the shunt acoustic wave resonator 512. The varactor 332 also comprises a varactor input terminal connected to the output terminal 22 of the active adjustment circuit 32, and the varactor 332 is connected in parallel to the shunt acoustic wave resonator 513. Each of the varactor 331 and the varactor 332 receives respectively an active thermal compensating signal from the active adjustment circuit 32, wherein the active thermal compensating signal is correlated to the thermal variation. And the active thermal compensating signal induces a varactor capacitance variation of each of the varactor 331 and the varactor 332 such that the varactor capacitance variation of each of the varactor 331 and the varactor 332 compensates the impact of the thermal variation to the acoustic wave device 11. In some embodiments, the location of the thermal sensing acoustic wave resonator 511(12) may be interchanged with any one of the two shunt acoustic wave resonators 512 and 513. For example, in some embodiments, the location of the thermal sensing acoustic wave resonator 511(12) is interchanged with the shunt acoustic wave resonator 512. Therefore, the new order becomes: the shunt acoustic wave resonator 512, the thermal sensing acoustic wave resonator 511(12), the shunt acoustic wave resonator 513.

In some other embodiments, the thermal sensing acoustic wave resonator 12 senses a thermal variation correlated to a resonance frequency variation of the thermal sensing acoustic wave resonator 12. A suitable design of the active adjustment circuit 32 for the thermal sensing acoustic wave resonator 12 sensing the thermal variation correlated to a resonance frequency variation of the thermal sensing acoustic wave resonator 12 is needed.

Please refer to FIG. 5F, which shows the schematic view of an embodiment of an integrated module of acoustic wave device with active thermal compensation of the present invention (the current embodiment is an application of the embodiment of FIG. 4A). The main structure of the embodiment of FIG. 5F is basically the same as the structure of the embodiment of FIG. 5E, except that the thermal sensing acoustic wave resonator 511(12) is not connected to the junction between the first acoustic wave resonators 501 and 502. Therefore, in current embodiment, the thermal sensing acoustic wave resonator 511(12) does not play a role of acoustic wave filtering. The thermal sensing acoustic wave resonator 511(12) only plays a role of thermal sensing. The thermal sensing acoustic wave resonator 511(12) is not a shunt acoustic wave resonator of the acoustic wave filter.

Figure 5H:
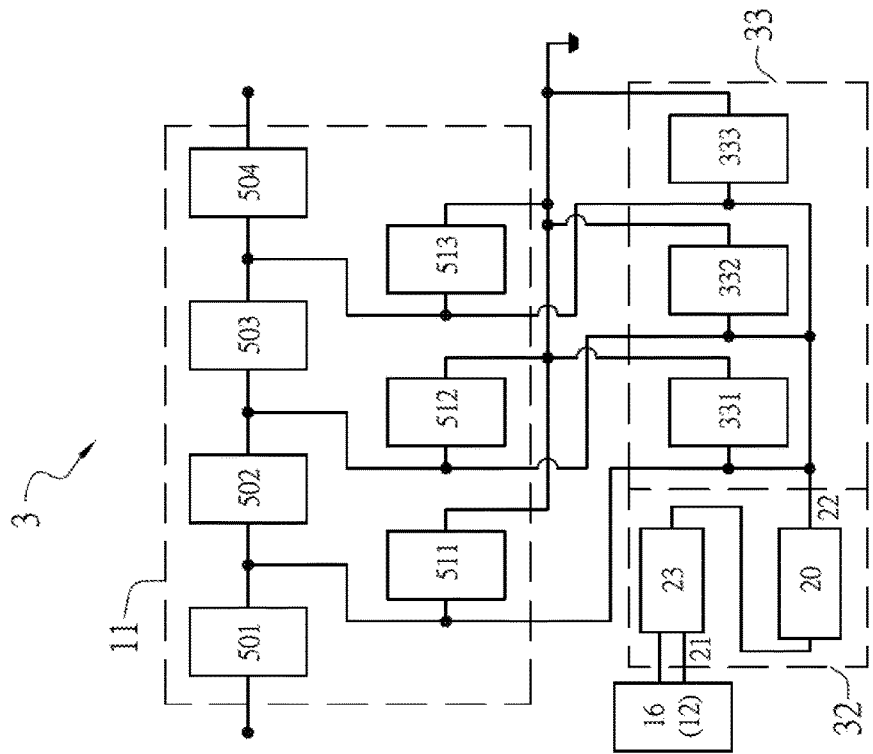
Figure 5G:
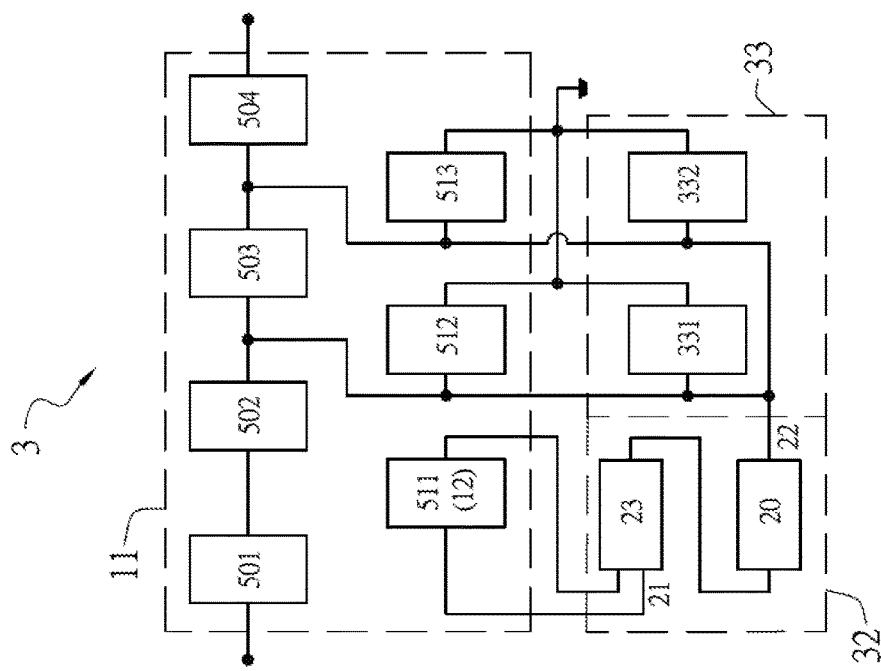

Please refer to FIG. 5G, which shows the schematic view of an embodiment of an integrated module of acoustic wave device with active thermal compensation of the present invention (the current embodiment is an application of the embodiment of FIG. 4A). The main structure of the embodiment of FIG. 5G is basically the same as the structure of the embodiment of FIG. 5F, except that none of the two terminals of the thermal sensing acoustic wave resonator 511(12) is connected to the ground. The thermal sensing acoustic wave resonator 511(12) is only connected in parallel to the input terminal 21 of the active adjustment circuit 32.

Please refer to FIG. 5H, which shows the schematic view of an embodiment of an integrated module of acoustic wave device with active thermal compensation of the present invention (the current embodiment is an application of the embodiment of FIG. 4A or FIG. 4B). The main structure of the integrated module 3 comprises an acoustic wave device 11, a thermal sensor 16, an active adjustment circuit 32 and a variable reactance device 33. In current embodiment, the acoustic wave device 11 is an acoustic wave filter. The acoustic wave filter comprises a plurality of second acoustic wave resonators 511, 512 and 513, and a plurality of first acoustic wave resonators 501, 502, 503 and 504. The first acoustic wave resonators 501, 502, 503 and 504 are series acoustic wave resonators of the acoustic wave filter. The second acoustic wave resonators 511, 512 and 513 are shunt acoustic wave resonators of the acoustic wave filter. The second acoustic wave resonators 511, 512 and 513, and the first acoustic wave resonators 501, 502, 503 and 504 may be surface acoustic wave resonators, bulk acoustic wave resonators or thin film bulk acoustic wave resonators. The four first acoustic wave resonators 501, 502, 503 and 504 are connected in series. Two terminals of the second acoustic wave resonator 511 are connected respectively to a ground and a junction between the first acoustic wave resonators 501 and 502. Two terminals of the second acoustic wave resonator 512 are connected respectively to the ground and a junction between the first acoustic wave resonators 502 and 503. Two terminals of the second acoustic wave resonator 513 are connected respectively to the ground and a junction between the first acoustic wave resonators 503 and 504. The active adjustment circuit 32 comprises an input terminal 21, a conversion circuit 23, a bias adjustment circuit 20 and an output terminal 22. The input terminal 21 is connected to the conversion circuit 23. An output terminal of the conversion circuit 23 is connected to an input terminal of the bias adjustment circuit 20. The bias adjustment circuit 20 is connected to the output terminal 22. The thermal sensor 16 is connected in parallel to the input terminal 21 of the active adjustment circuit 32. In some embodiments, the thermal sensor 16 is a thermal sensitive resistance sensor or a third type of the thermal sensing acoustic wave resonator 12. The active adjustment circuit 32 may be one of the active adjustment circuits 32 shown in FIGS. 2B~2D, 2R~2T and 3A~3H. In some other embodiments, the thermal sensor 16 is a thermal sensitive capacitor sensor, or a first type or a second type of the thermal sensing acoustic wave resonator 12. The active adjustment circuit 32 may be one of the active adjustment circuits 32 shown in FIGS. 2I, 2J and 2M~2P. In some other embodiments, the thermal sensor 16 is a thermal sensitive diode sensor. The active adjustment circuit 32 may be one of the active adjustment circuits 32 shown in FIGS. 2E~2G and 2K~2P. In some other embodiments, the thermal sensor 16 is a thermal sensitive transistor sensor. The active adjustment circuit 32 may be one of the active adjustment circuits 32 shown in FIGS. 2U~2W. In current embodiment, the variable reactance device 33 is a variable capacitance device, wherein the variable capacitance device comprises a varactor 331, a varactor 332 and a varactor 333. The varactor 331 comprises a varactor input terminal connected to the output terminal 22 of the active adjustment circuit 32, and the varactor 331 is connected in parallel to the shunt acoustic wave resonator 511. The varactor 332 comprises a varactor input terminal connected to the output terminal 22 of the active adjustment circuit 32, and the varactor 332 is connected in parallel to the shunt acoustic wave resonator 512. The varactor 333 comprises a varactor input terminal connected to the output terminal 22 of the active adjustment circuit 32, and the varactor 333 is connected in parallel to the shunt acoustic wave resonator 513. Each of the varactor 331, the varactor 332 and the varactor 333 receives respectively an active thermal compensating signal from the active adjustment circuit 32, wherein the active thermal compensating signal is correlated to the thermal variation. And the active thermal compensating signal induces a varactor capacitance variation of each of the varactor 331, the varactor 332 and the varactor 333 such that the varactor capacitance variation of each of the varactor 331, the varactor 332 and the varactor 333 compensates the impact of the thermal variation to the acoustic wave device 11. The acoustic wave device 11 is formed on a first substrate (not shown in the Figure), wherein the material of the first substrate is one material selected from the group consisting of glass, $LiTaO_3$, $LiNbO_3$, quartz, Si, GaAs, GaP, sapphire, $Al_2O_3$, InP, SiC, diamond, GaN and AlN. In some embodiments, the thermal sensor 16 may be formed on the first substrate (an application of the embodiment of FIG. 4A). In some other embodiments, the thermal sensor 16 may be formed on a second substrate (an application of the embodiment of FIG. 4B). In some embodiments, the material of the second substrate is one material selected from the group consisting of glass, $LiTaO_3$, $LiNbO_3$, quartz, Si, GaAs, GaP, sapphire, $Al_2O_3$, InP, SiC, diamond, GaN and AlN. In some embodiments, the thermal sensor 16 may be a thermal sensing acoustic wave resonator 12, wherein the thermal sensing acoustic wave resonator 12 is one of a surface acoustic wave resonator, a bulk acoustic wave resonator and a thin film bulk acoustic wave resonator, wherein the thermal sensing acoustic wave resonator 12 senses a thermal variation correlated to a capacitance variation of the thermal sensing acoustic wave resonator 12. In some other embodiments, the thermal sensor 16 may be a third type of the thermal sensing acoustic wave resonator 12.

The present invention further provides an active thermal compensating method for an integrated module of acoustic wave device with active thermal compensation of one of the embodiments shown in FIGS. 5A~5D. The active thermal compensating method comprises following steps of: sensing a thermal variation by at least one of the first meandered-shaped reflector 413 and the second meandered-shaped reflector 414; and outputting an active thermal compensating signal to the varactor 331, the varactor 332 and the varactor 333 by an active adjustment circuit 32, wherein the active thermal compensating signal is correlated to the thermal variation, wherein the active thermal compensating signal induces a varactor capacitance variation of each of the varactor 331, the varactor 332 and the varactor 333 such that the varactor capacitance variation of each of the varactor 331, the varactor 332 and the varactor 333 compensates the impact of the thermal variation to the acoustic wave device 11.

The present invention further provides an active thermal compensating method for an integrated module of acoustic wave device with active thermal compensation of one of the embodiments shown in FIGS. 5E~5H. The active thermal compensating method comprises following steps of: sensing a thermal variation by the thermal sensing acoustic wave resonator 511(12) (thermal sensor 16 in the embodiment of FIG. 5H); and outputting an active thermal compensating signal to the varactor 331 and the varactor 332 (and the varactor 333 in the embodiment of FIG. 5H) by an active adjustment circuit 32, wherein the active thermal compensating signal is correlated to the thermal variation, wherein the active thermal compensating signal induces a varactor capacitance variation of each of the varactor 331 and the varactor 332 (and the varactor 333 in the embodiment of FIG. 5H) such that the varactor capacitance variation of each of the varactor 331 and the varactor 332 (and the varactor 333 in the embodiment of FIG. 5H) compensates the impact of the thermal variation to the acoustic wave device 11.

Figure 5I:
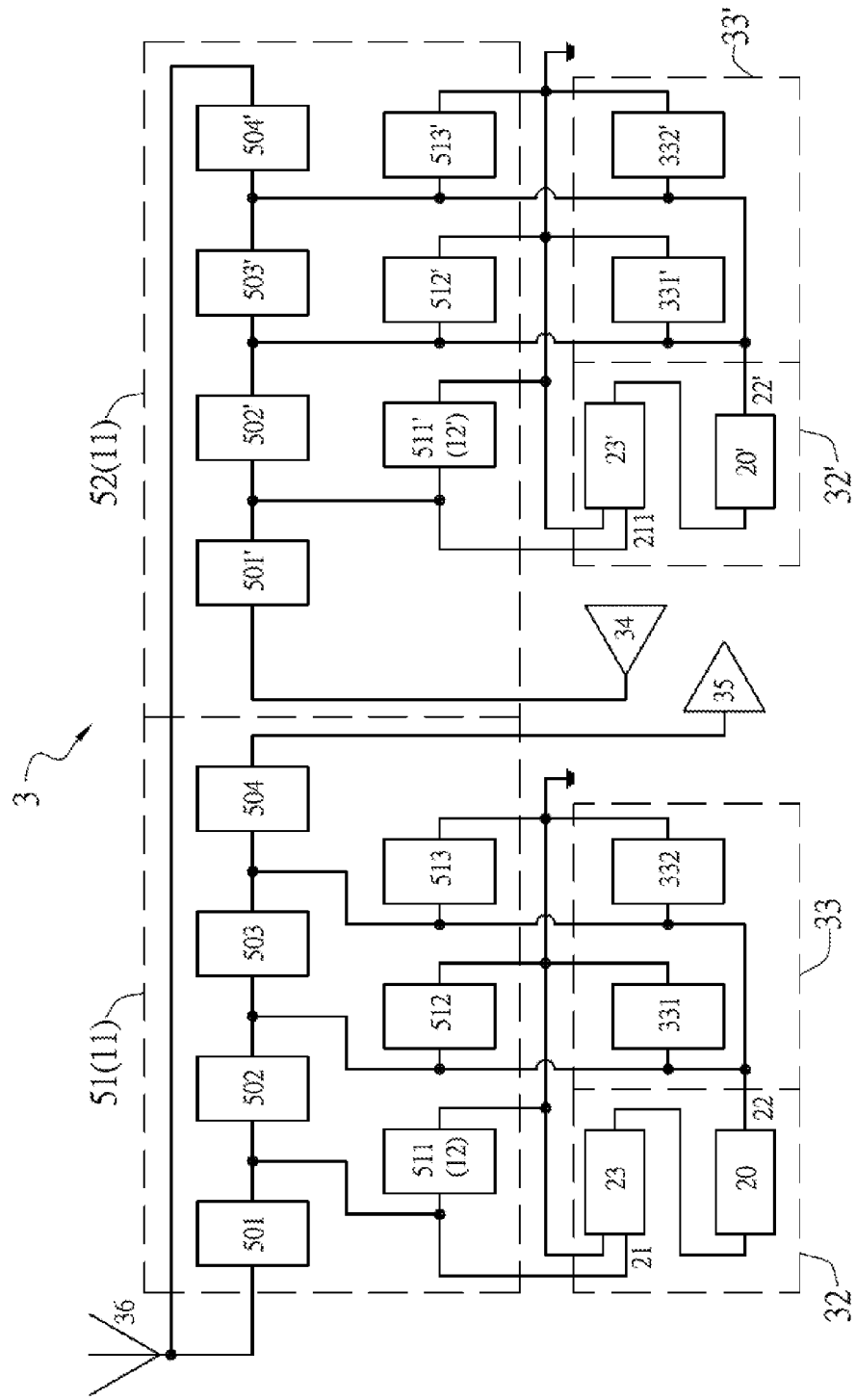
FIGS. 5I and 5J are the schematic views of the embodiments of an integrated module of acoustic wave device with active thermal compensation of the present invention.

Please refer to FIG. 5I, which shows the schematic view of an embodiment of an integrated module of acoustic wave device with active thermal compensation of the present invention. The main structure of the integrated module 3 comprises an acoustic wave device 11, a first active adjustment circuit 32, a second active adjustment circuit 32', a first variable reactance device 33, a second variable reactance device 33', a power amplifier 34, a low noise amplifier 35 and an antenna 36. The acoustic wave device 11 is formed on a first substrate (not shown in the Figure), wherein the material of the first substrate is one material selected from the group consisting of glass, LiTaO$_3$, LiNbO$_3$, quartz, Si, GaAs, GaP, sapphire, Al$_2$O$_3$, InP, SiC, diamond, GaN and AlN. In current embodiment, the acoustic wave device 11 is an acoustic wave duplexer. The acoustic wave duplexer comprises a receiver acoustic wave filter 51 and a transmitter acoustic wave filter 52. The receiver acoustic wave filter 51 comprises a first thermal sensing acoustic wave resonator 511(12), second acoustic wave resonators 512 and 513, and first acoustic wave resonators 501, 502, 503 and 504. The first acoustic wave resonators 501, 502, 503 and 504 are series acoustic wave resonators of the receiver acoustic wave filter 51. The second acoustic wave resonators 512 and 513 are shunt acoustic wave resonators of the receiver acoustic wave filter 51. In current embodiment, the first thermal sensing acoustic wave resonator 511(12) is a thermal sensor and also a shunt acoustic wave resonator of the receiver acoustic wave filter 51. The first thermal sensing acoustic wave resonator 511(12) plays dual roles of thermal sensing and acoustic wave filtering. The first thermal sensing acoustic wave resonator 511(12) senses a first thermal variation correlated to a first capacitance variation of the first thermal sensing acoustic wave resonator 511(12). The first thermal sensing acoustic wave resonator 511(12), the second acoustic wave resonators 512 and 513, and the first acoustic wave resonators 501, 502, 503 and 504 may be surface acoustic wave resonators, bulk acoustic wave resonators or thin film bulk acoustic wave resonators. The four first acoustic wave resonators 501, 502, 503 and 504 are connected in series. One terminal of the first acoustic wave resonator 501 is connected to the antenna 36. One terminal of the first acoustic wave resonator 504 is connected to the low power amplifier 35. Two terminals of the first thermal sensing acoustic wave resonator 511(12) are connected respectively to a ground and a junction between the first acoustic wave resonators 501 and 502. Two terminals of the second acoustic wave resonator 512 are connected respectively to the ground and a junction between the first acoustic wave resonators 502 and 503. Two terminals of the second acoustic wave resonator 513 are connected respectively to the ground and a junction between the first acoustic wave resonators 503 and 504. The first active adjustment circuit 32 comprises a first input terminal 21, a first conversion circuit 23, a first bias adjustment circuit 20 and a first output terminal 22. The first input terminal 21 is connected to the first conversion circuit 23. An output terminal of the first conversion circuit 23 is connected to an input terminal of the first bias adjustment circuit 20. The first bias adjustment circuit 20 is connected to the first output terminal 22. In some embodiments, the first active adjustment circuit 32 may be one of the active adjustment circuits 32 shown in FIGS. 2I and 2J. In some other embodiments, the first active adjustment circuit 32 may be one of the active adjustment circuits 32 shown in FIGS. 2M~2P. The first thermal sensing acoustic wave resonator 511(12) is connected in parallel to the first input terminal 21 of the first active adjustment circuit 32. In current embodiment, the first variable reactance device 33 is a variable capacitance device which comprises a first varactor 331 and a first varactor 332. The first varactor 331 comprises a first varactor input terminal connected to the first output terminal 22 of the first active adjustment circuit 32, and the first varactor 331 is connected in parallel to the shunt acoustic wave resonator 512. The first varactor 332 also comprises a first varactor input terminal connected to the first output terminal 22 of the first active adjustment circuit 32, and the first varactor 332 is connected in parallel to the shunt acoustic wave resonator 513. Each of the first varactor 331 and the first varactor 332 receives respectively a first active thermal compensating signal from the first active adjustment circuit 32, wherein the first active thermal compensating signal is correlated to the first thermal variation. And the first active thermal compensating signal induces a first varactor capacitance variation of each of the first varactor 331 and the first varactor 332 such that the first varactor capacitance variation of each of the first varactor 331 and the first varactor 332 compensates the impact of the first thermal variation to the receiver acoustic wave filter 51 of the acoustic wave device 11. The transmitter acoustic wave filter 52 comprises a second thermal sensing acoustic wave resonator 511'(12), fourth acoustic wave resonators 512' and 513', and third acoustic wave resonators 501', 502', 503' and 504'. The third acoustic wave resonators 501', 502', 503' and 504' are series acoustic wave resonators of the transmitter acoustic wave filter 52. The fourth acoustic wave resonators 512' and 513' are shunt acoustic wave resonators of the transmitter acoustic wave filter 52. In current embodiment, the second thermal sensing acoustic wave resonator 511'(12) is a thermal sensor and also a shunt acoustic wave resonator of the transmitter acoustic wave filter 52. The second thermal sensing acoustic wave resonator 511'(12) plays dual roles of thermal sensing and acoustic wave filtering. The second thermal sensing acoustic wave resonator 511'(12) senses a second thermal variation correlated to a second capacitance variation of the second thermal sensing acoustic wave resonator 511'(12). The second thermal sensing acoustic wave resonator 511'(12), the fourth acoustic wave resonators 512' and 513', and the third acoustic wave resonators 501', 502', 503' and 504' may be surface acoustic wave resonators, bulk acoustic wave resonators or thin film bulk acoustic wave resonators. The four third acoustic wave resonators 501', 502', 503' and 504' are connected in series. One terminal of the third acoustic wave resonator 501' is connected to the power amplifier 34. One terminal of the third acoustic wave resonator 504' is connected to the antenna 36. Two terminals of the second thermal sensing acoustic wave resonator 511'(12) are connected respectively to a ground and a junction between the third acoustic wave resonators 501' and 502'. Two terminals of the fourth acoustic wave resonator 512' are connected respectively to the ground and a junction between the third acoustic wave resonators 502' and 503'. Two terminals of the fourth acoustic wave resonator 513' are connected respectively to the ground and a junction between the third acoustic wave resonators 503' and 504'. The second active adjustment circuit 32' comprises a second input terminal 211, a second conversion circuit 23', a second bias adjustment circuit 20' and a second output terminal 22'. The second input terminal 211 is connected to the second conversion circuit 23'. An output terminal of the second conversion circuit 23' is connected to an input terminal of the second bias adjustment circuit 20'. The second bias adjustment circuit 20' is connected to the second output terminal 22'. In some embodiments, the second active adjustment circuit 32' may be one of the active adjustment circuits 32' shown in FIGS. 2I and 2J. In some other embodiments, the second active adjustment circuit 32' may be one of the active adjustment circuits 32' shown in FIGS. 2M~2P. The second thermal sensing acoustic wave resonator 511'(12) is connected in parallel to the second input terminal 211 of the second active adjustment circuit 32'. In current embodiment, the second variable reactance device 33' comprises a second varactor 331' and a second varactor 332'. The second varactor 331' comprises a second varactor input terminal connected to the second output terminal 22' of the second active adjustment circuit 32', and the second varactor 331' is connected in parallel to the shunt acoustic wave resonator 512'. The second varactor 332' also comprises a second varactor input terminal connected to the second output terminal 22' of the second active adjustment circuit 32', and the second varactor 332' is connected in parallel to the shunt acoustic wave resonator 513'. Each of the second varactor 331' and the second varactor 332' receives respectively a second active thermal compensating signal from the second active adjustment circuit 32', wherein the second active thermal compensating signal is correlated to the second thermal variation. And the second active thermal compensating signal induces a second varactor capacitance variation of each of the second varactor 331' and the second varactor 332' such that the second varactor capacitance variation of each of the second varactor 331' and the second varactor 332' compensates the impact of the second thermal variation to the transmitter acoustic wave filter 52 of the acoustic wave device 11. In current embodiment, both the receiver acoustic wave filter 51 and the transmitter acoustic wave filter 52 have the same structure as the embodiment of FIG. 5E.

In some embodiments, the first active adjustment circuit 32 and the first variable reactance device 33 are formed on a first circuit substrate, while the second active adjustment circuit 32' and the second variable reactance device 33' are formed on a second circuit substrate (not shown in the Figure). In some other embodiments, the first active adjustment circuit 32, the first variable reactance device 33, the second active adjustment circuit 32' and the second variable reactance device 33' are formed on a circuit substrate (not shown in the Figure). In some embodiments, the acoustic wave device 11, the first active adjustment circuit 32 and the first variable reactance device 33 are formed on the first circuit substrate (not shown in the Figure). In some other embodiments, the acoustic wave device 11, the first active adjustment circuit 32 and the first variable reactance device 33, the second active adjustment circuit 32' and the second variable reactance device 33' are formed on the first circuit substrate (not shown in the Figure). In some embodiments, the power amplifier 34 and the low noise amplifier 35 are formed on an amplifier substrate (not shown in the Figure). In some embodiments, the first active adjustment circuit 32, the first variable reactance device 33, the power amplifier 34 and the low noise amplifier 35 are formed on a circuit substrate (not shown in the Figure). In some other embodiments, the first active adjustment circuit 32, the first variable reactance device 33, the second active adjustment circuit 32', the second variable reactance device 33', the power amplifier 34 and the low noise amplifier 35 are formed on a circuit substrate (not shown in the Figure). In some other embodiments, the acoustic wave device 11, the first active adjustment circuit 32 and the first variable reactance device 33, the second active adjustment circuit 32', the second variable reactance device 33', the power amplifier 34 and the low noise amplifier 35 are formed on the first circuit substrate (not shown in the Figure). In some other embodiments, the acoustic wave device 11, the first active adjustment circuit 32 and the first variable reactance device 33, the power amplifier 34 and the low noise amplifier 35 are formed on the first circuit substrate (not shown in the Figure).

Figure 5J:
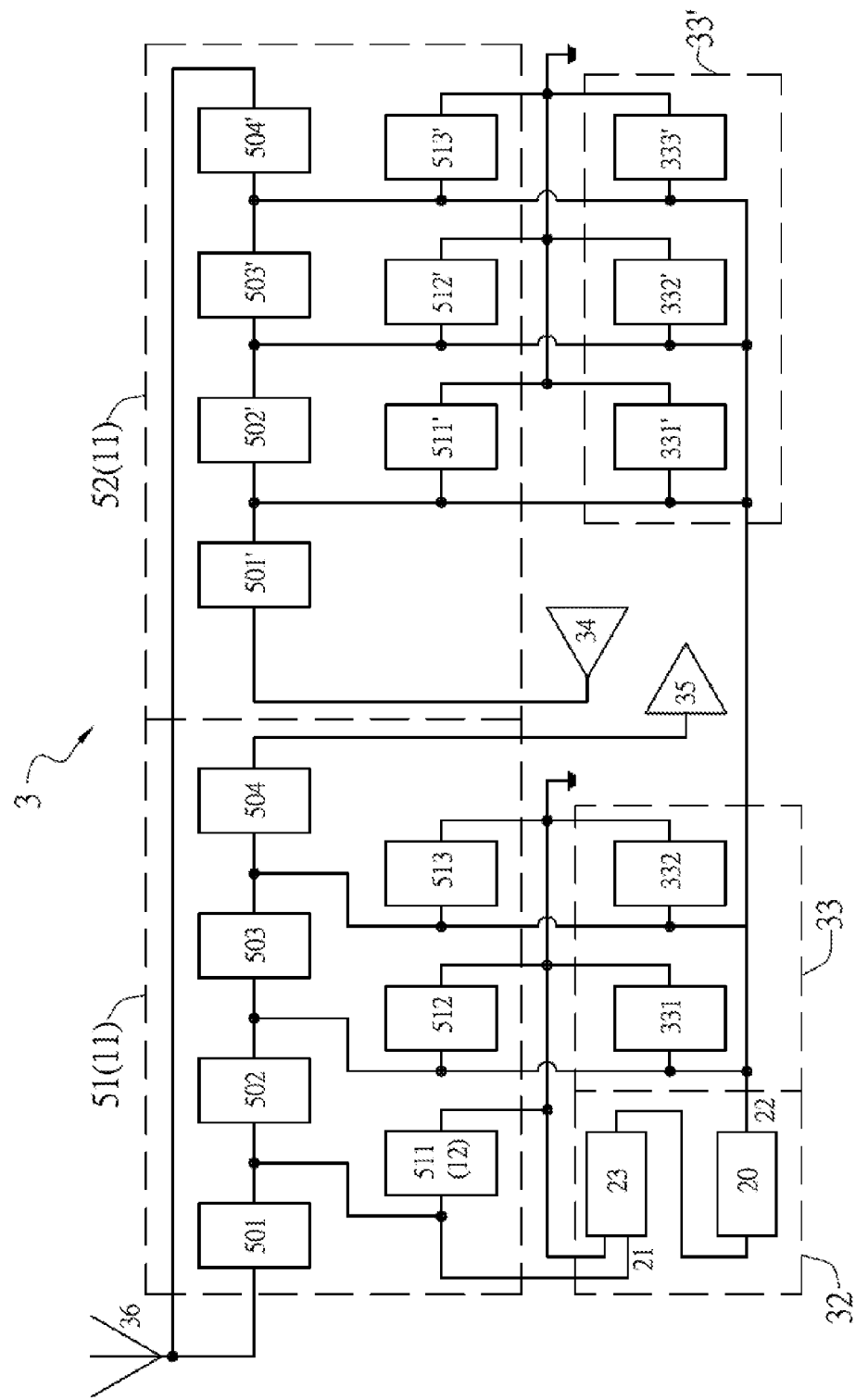

Please refer to FIG. 5J, which shows the schematic view of an embodiment of an integrated module of acoustic wave device with active thermal compensation of the present invention. The main structure of the embodiment of FIG. 5J is basically the same as the structure of the embodiment of FIG. 5I, except that a fourth acoustic wave resonator 511' does not play a role of thermal sensing, wherein the structure of the integrated module 3 does not include the second active adjustment circuit 32', wherein the second variable reactance device 33' further comprises a second varactor 331'. Two terminals of the fourth acoustic wave resonator 511' are connected respectively to the ground and a junction between the third acoustic wave resonators 501' and 502'. The second varactor 331' comprises a second varactor input terminal connected to the first output terminal 22 of the first active adjustment circuit 32, and the second varactor 331' is connected in parallel to the shunt acoustic wave resonator 511'. The second varactor 332' also comprises a second varactor input terminal connected to the first output terminal 22 of the first active adjustment circuit 32, and the second varactor 332' is connected in parallel to the shunt acoustic wave resonator 512'. The second varactor 333' comprises a second varactor input terminal connected to the first output terminal 22 of the first active adjustment circuit 32, and the second varactor 333' is connected in parallel to the shunt acoustic wave resonator 513'. Each of the second varactor 331', the second varactor 332' and the second varactor 333' receives respectively the first active thermal compensating signal from the first active adjustment circuit 32, wherein the first active thermal compensating signal is correlated to the first thermal variation. And the first active thermal compensating signal induces a second varactor capacitance variation of each of the second varactor 331', the second varactor 332' and the second varactor 333' such that the second varactor capacitance variation of each of the second varactor 331', the second varactor 332' and the second varactor 333' compensates the impact of the first thermal variation to the transmitter acoustic wave filter 52 of the acoustic wave device 11.

Figure 5K:
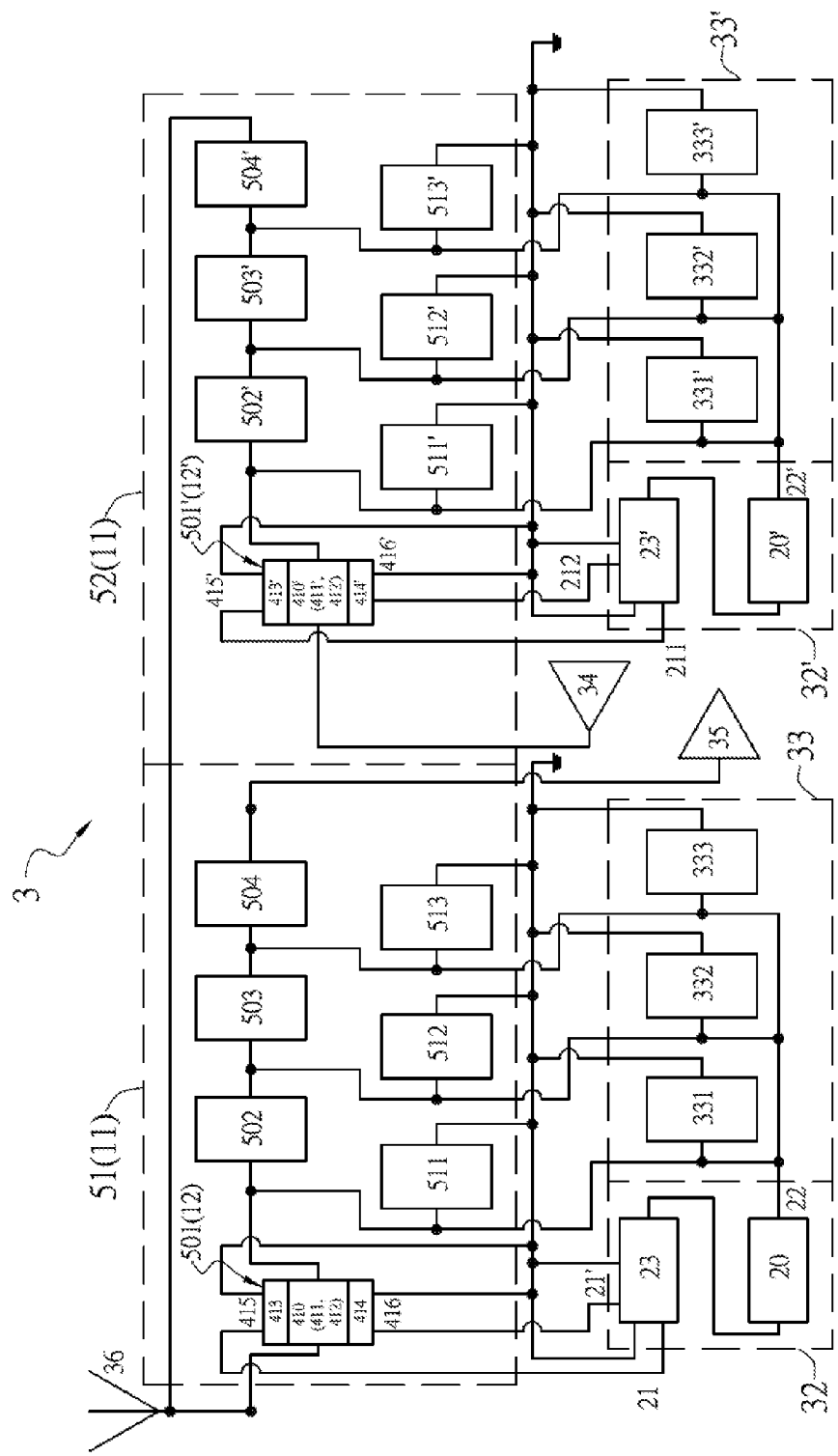
FIGS. 5K and 5L are the schematic views of the embodiments of an integrated module of acoustic wave device with active thermal compensation of the present invention.

Please refer to FIG. 5K, which shows the schematic view of an embodiment of an integrated module of acoustic wave device with active thermal compensation of the present invention. The main structure of the integrated module 3 comprises an acoustic wave device 11, a first active adjustment circuit 32, a second active adjustment circuit 32', a first variable reactance device 33, a second variable reactance device 33', a power amplifier 34, a low noise amplifier 35 and an antenna 36. The acoustic wave device 11 is formed on a first substrate (not shown in the Figure), wherein the material of the first substrate is one material selected from the group consisting of glass, $LiTaO_3$, $LiNbO_3$, quartz, Si, GaAs, GaP, sapphire, $Al_2O_3$, InP, SiC, diamond, GaN and AlN. In current embodiment, the acoustic wave device 11 is an acoustic wave duplexer. The acoustic wave duplexer comprises a receiver acoustic wave filter 51 and a transmitter acoustic wave filter 52. The receiver acoustic wave filter 51 comprises a first thermal sensing acoustic wave resonator 501(12), second acoustic wave resonators 511, 512 and 513, and first acoustic wave resonators 502, 503 and 504. The first acoustic wave resonators 502, 503 and 504 are series acoustic wave resonators of the receiver acoustic wave filter 51. The second acoustic wave resonators 511, 512 and 513 are shunt acoustic wave resonators of the receiver acoustic wave filter 51. The first thermal sensing acoustic wave resonator 501(12) is a third type of the thermal sensing acoustic wave resonator 12. The first thermal sensing acoustic wave resonator 501(12) comprises a first meandered-shaped reflector 413 (which plays a role of thermal sensing), a second meandered-shaped reflector 414 (which plays a role of thermal sensing) and two interlocking comb-shaped electrodes 411, 412 of an interdigital transducer 410. The two meandered-shaped reflectors 413, 414 are formed respectively at two sides of the two interlocking comb-shaped electrodes 411, 412 of the interdigital transducer 410. The first thermal sensing acoustic wave resonator 501(12) further comprises an output terminal 415 of the first meandered-shaped reflector 413 and an output terminal 416 of the second meandered-shaped reflector 414. In current embodiment, the first thermal sensing acoustic wave resonator 501(12) is a thermal sensor and also a series acoustic wave resonator of the receiver acoustic wave filter 51. The first thermal sensing acoustic wave resonator 501(12) plays dual roles of thermal sensing and acoustic wave filtering. The first thermal sensing acoustic wave resonator 501(12) senses a first thermal variation correlated to a first resistance variation of the first thermal sensing acoustic wave resonator 501(12). The second acoustic wave resonators 511, 512 and 513, and the first acoustic wave resonators 502, 503 and 504 are surface acoustic wave resonators. The first thermal sensing acoustic wave resonator 501(12) and the three first acoustic wave resonators 502, 503 and 504 are connected in series. One terminal of the first acoustic wave resonator 501 is connected to the antenna 36. One terminal of the first acoustic wave resonator 504 is connected to the low power amplifier 35. Two terminals of the second acoustic wave resonator 511 are connected respectively to a ground and a junction between the first thermal sensing acoustic wave resonator 501(12) and the first acoustic wave resonator 502. Two terminals of the second acoustic wave resonator 512 are connected respectively to the ground and a junction between the first acoustic wave resonators 502 and 503. Two terminals of the second acoustic wave resonator 513 are connected respectively to the ground and a junction between the first acoustic wave resonators 503 and 504. The first active adjustment circuit 32 comprises first input terminals 21, 21', a first conversion circuit 23, a first bias adjustment circuit 20 and a first output terminal 22. The first input terminals 21, 21' are connected to the first conversion circuit 23. An output terminal of the first conversion circuit 23 is connected to an input terminal of the first bias adjustment circuit 20. The first bias adjustment circuit 20 is connected to the first output terminal 22. In some embodiment, the first active adjustment circuit 32 may be one of the active adjustment circuits 32 shown in FIGS. 3E~3H. The output terminal 415 of the first meandered-shaped reflector 413 of the first thermal sensing acoustic wave resonator 501(12) is connected in parallel to the first input terminal 21 of the first active adjustment circuit 32. The output terminal 416 of the second meandered-shaped reflector 414 of the first thermal sensing acoustic wave resonator 501(12) is connected in parallel to the first input terminal 21' of the first active adjustment circuit 32. In current embodiment, the first variable reactance device 33 is a variable capacitance device which comprises a first varactor 331, a first varactor 332 and a first varactor 333. The first varactor 331 comprises a first varactor input terminal connected to the first output terminal 22 of the first active adjustment circuit 32, and the first varactor 331 is connected in parallel to the shunt acoustic wave resonator 511. The first varactor 332 comprises a first varactor input terminal connected to the first output terminal 22 of the first active adjustment circuit 32, and the first varactor 332 is connected in parallel to the shunt acoustic wave resonator 512. The first varactor 333 comprises a first varactor input terminal connected to the first output terminal 22 of the first active adjustment circuit 32, and the first varactor 333 is connected in parallel to the shunt acoustic wave resonator 513. Each of the first varactor 331, the first varactor 332 and the first varactor 333 receives respectively a first active thermal compensating signal from the first active adjustment circuit 32, wherein the first active thermal compensating signal is correlated to the first thermal variation. And the first active thermal compensating signal induces a first varactor capacitance variation of each of the first varactor 331, the first varactor 332 and the first varactor 333 such that the first varactor capacitance variation of each of the first varactor 331, the first varactor 332 and the first varactor 333 compensates the impact of the first thermal variation to the receiver acoustic wave filter 51 of the acoustic wave device 11. The transmitter acoustic wave filter 52 comprises a second thermal sensing acoustic wave resonator 501'(12'), fourth acoustic wave resonators 511', 512' and 513', and third acoustic wave resonators 502', 503' and 504'. The third acoustic wave resonators 502', 503' and 504' are series acoustic wave resonators of the transmitter acoustic wave filter 52. The fourth acoustic wave resonators 511', 512' and 513' are shunt acoustic wave resonators of the transmitter acoustic wave filter 52. In current embodiment, the second thermal sensing acoustic wave resonator 501'(12') is a third type of the thermal sensing acoustic wave resonator 12. The second thermal sensing acoustic wave resonator 501'(12') comprises a first meandered-shaped reflector 413'(which plays a role of thermal sensing), a second meandered-shaped reflector 414'(which plays a role of thermal sensing) and two interlocking comb-shaped electrodes 411', 412' of an interdigital transducer 410'. The two meandered-shaped reflectors 413', 414' are formed respectively at two sides of the two interlocking comb-shaped electrodes 411', 412' of the interdigital transducer 410'. The second thermal sensing acoustic wave resonator 501'(12') further comprises an output terminal 415' of the first meandered-shaped reflector 413' and an output terminal 416' of the second meandered-shaped reflector 414'. The second thermal sensing acoustic wave resonator 501'(12') is a thermal sensor and also a series acoustic wave resonator of the transmitter acoustic wave filter 52. The second thermal sensing acoustic wave resonator 501'(12') plays dual roles of thermal sensing and acoustic wave filtering. The second thermal sensing acoustic wave resonator 501'(12') senses a second thermal variation correlated to a second resistance variation of the second thermal sensing acoustic wave resonator 501'(12'). The fourth acoustic wave resonators 511', 512' and 513', and the third acoustic wave resonators 502', 503' and 504' are surface acoustic wave resonators. The second thermal sensing acoustic wave resonator 501'(12') and the three third acoustic wave resonators 502', 503' and 504' are connected in series. One terminal of the third acoustic wave resonator 501' is connected to the power amplifier 34. One terminal of the third acoustic wave resonator 504' is connected to the antenna 36. Two terminals of the fourth acoustic wave resonator 511' are connected respectively to a ground and a junction between the second thermal sensing acoustic wave resonator 501'(12') and the third acoustic wave resonator 502'. Two terminals of the fourth acoustic wave resonator 512' are connected respectively to the ground and a junction between the third acoustic wave resonators 502' and 503'. Two terminals of the fourth acoustic wave resonator 513' are connected respectively to the ground and a junction between the third acoustic wave resonators 503' and 504'. The second active adjustment circuit 32' comprises second input terminals 211, 212, a second conversion circuit 23', a second bias adjustment circuit 20' and a second output terminal 22'. The second input terminals 211, 212 are connected to the second conversion circuit 23'. An output terminal of the second conversion circuit 23' is connected to an input terminal of the second bias adjustment circuit 20'. The second bias adjustment circuit 20' is connected to the second output terminal 22'. In current embodiment, the second active adjustment circuit 32' may be one of the active adjustment circuits 32' shown in FIGS. 3E~3H. The output terminal 415' of the first meandered-shaped reflector 413' of the second thermal sensing acoustic wave resonator 501'(12') is connected in parallel to the second input terminal 211 of the second active adjustment circuit 32'. The output terminal 416' of the second meandered-shaped reflector 414' of the second thermal sensing acoustic wave resonator 501'(12') is connected in parallel to the second input terminal 212 of the second active adjustment circuit 32'. In current embodiment, the second variable reactance device 33' comprises a second varactor 331', a second varactor 332' and a second varactor 333'. The second varactor 331' comprises a second varactor input terminal connected to the second output terminal 22' of the second active adjustment circuit 32', and the second varactor 331' is connected in parallel to the fourth acoustic wave resonator 511'. The second varactor 332' comprises a second varactor input terminal connected to the second output terminal 22' of the second active adjustment circuit 32', and the second varactor 332' is connected in parallel to the fourth acoustic wave resonator 512'. The second varactor 333' comprises a second varactor input terminal connected to the second output terminal 22' of the second active adjustment circuit 32', and the second varactor 333' is connected in parallel to the fourth acoustic wave resonator 513'. Each of the second varactor 331', the second varactor 332' and the second varactor 333' receives respectively a second active thermal compensating signal from the second active adjustment circuit 32', wherein the second active thermal compensating signal is correlated to the second thermal variation. And the second active thermal compensating signal induces a second varactor capacitance variation of each of the second varactor 331', the second varactor 332' and the second varactor 333' such that the second varactor capacitance variation of each of the second varactor 331', the second varactor 332' and the second varactor 333' compensates the impact of the second thermal variation to the transmitter acoustic wave filter 52 of the acoustic wave device 11.

Figure 5L:
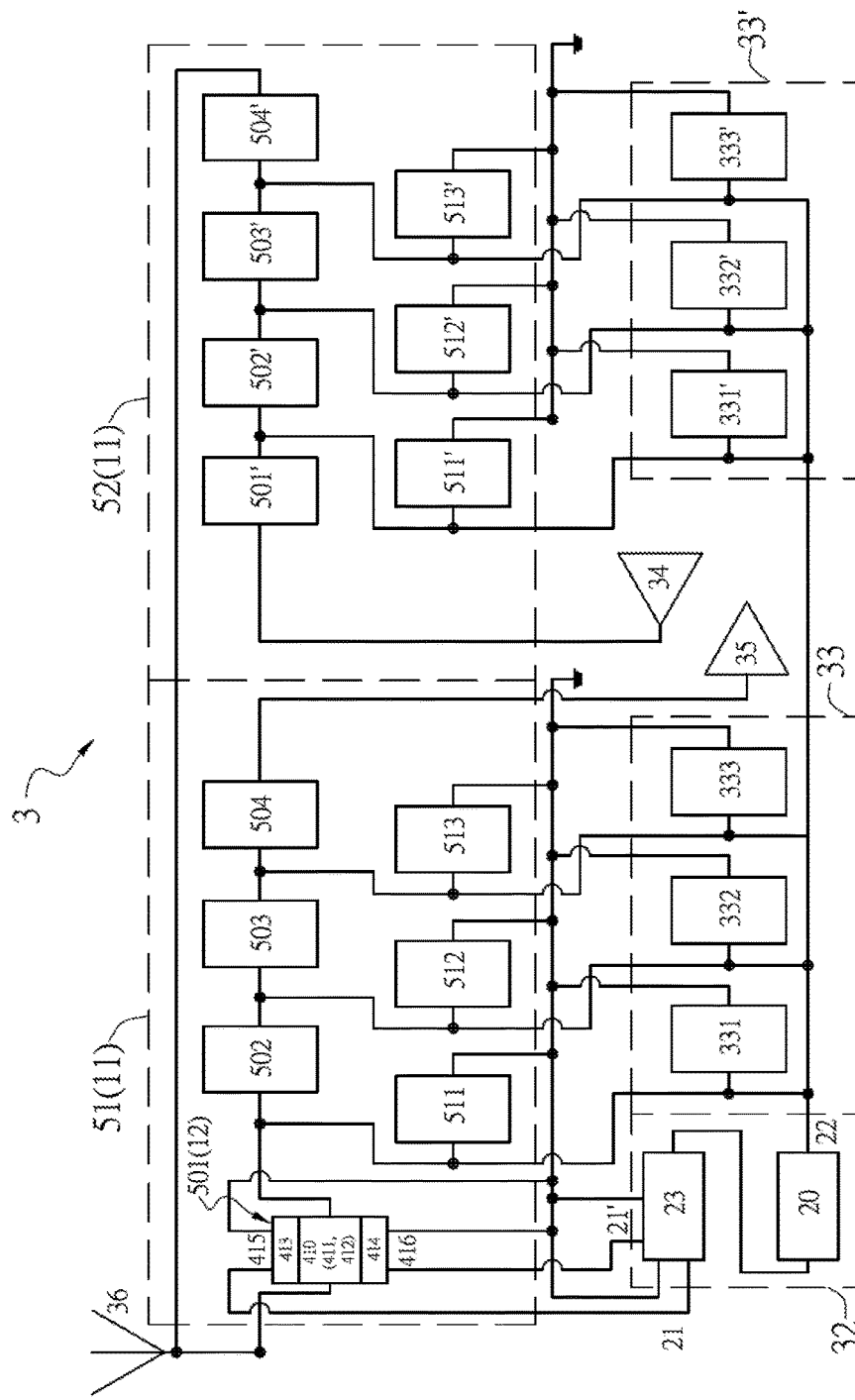

Please refer to FIG. 5L, which shows the schematic view of an embodiment of an integrated module of acoustic wave device with active thermal compensation of the present invention. The main structure of the embodiment of FIG. 5L is basically the same as the structure of the embodiment of FIG. 5K, except that a third acoustic wave resonator 501' does not play a role of thermal sensing, wherein the structure of the integrated module 3 does not include the second active adjustment circuit 32'. One terminal of the third acoustic wave resonator 501' is connected to the power amplifier 34. The other terminal of the third acoustic wave resonator 501' is connected to the third acoustic wave resonators 501'. The second varactor 331' comprises a second varactor input terminal connected to the first output terminal 22 of the first active adjustment circuit 32, and the second varactor 331' is connected in parallel to the fourth acoustic wave resonator 511'. The second varactor 332' also comprises a second varactor input terminal connected to the first output terminal 22 of the first active adjustment circuit 32, and the second varactor 332' is connected in parallel to the fourth acoustic wave resonator 512'. The second varactor 333' comprises a second varactor input terminal connected to the first output terminal 22 of the first active adjustment circuit 32, and the second varactor 333' is connected in parallel to the fourth acoustic wave resonator 513'. Each of the second varactor 331', the second varactor 332' and the second varactor 333' receives respectively the first active thermal compensating signal from the first active adjustment circuit 32, wherein the first active thermal compensating signal is correlated to the first thermal variation. And the first active thermal compensating signal induces a second varactor capacitance variation of each of the second varactor 331', the second varactor 332' and the second varactor 333' such that the second varactor capacitance variation of each of the second varactor 331', the second varactor 332' and the second varactor 333' compensates the impact of the first thermal variation to the transmitter acoustic wave filter 52 of the acoustic wave device 11.

In the embodiments of FIGS. 5A~5L, the variable reactance device (for example, 33 or 33') comprises at least one varactor (for example, 331, 332, 333, 331', 332' or 333'). Each varactor (for example, 331, 332, 333, 331', 332' or 333') is connected in parallel to one of the shunt acoustic wave resonators (for example, 511, 512, 513, 511', 512' or 513') of the acoustic wave filter (for example, 51 or 52 in FIGS. 5I~5L, or 11 in FIGS. 5A~5H). In some embodiments, each varactor (for example, 331, 332, 333, 331', 332' or 333') is connected in parallel to one of the series acoustic wave resonators (for example, 501, 502, 503, 504, 501', 502', 503' or 504') of the acoustic wave filter (for example, 51 or 52 in FIGS. 5I~5L, or 11 in FIGS. 5A~5H). In some other embodiments, each varactor is connected in parallel to one of the series acoustic wave resonators and the shunt acoustic wave resonators of the acoustic wave filter. In some embodiments, each of the series acoustic wave resonators and the shunt acoustic wave resonators of the acoustic wave filter is connected in parallel to one varactor.

As disclosed in the above description and attached drawings, the present invention can provide a thermal sensor circuit. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. A thermal sensor circuit comprising:
    a conversion circuit, wherein said conversion circuit is one selected from the group consisting of a buck DC-DC converter circuit and a boost DC-DC converter circuit, wherein said conversion circuit comprises:
        an inductor, wherein said inductor is connected in parallel to a thermal sensor; and
        an output terminal of said conversion circuit for outputting a converted circuit signal;
    wherein said thermal sensor senses a thermal variation correlated to a capacitance variation of said thermal sensor, wherein said capacitance variation of said thermal sensor induces a variation of an internal parasitic capacitance of said inductor causing a variation of an energy stored in said inductor, thereby said variation of said energy stored in said inductor causes a variation of said converted circuit signal, hence said variation of said converted circuit signal is correlated to said thermal variation.

2. The thermal sensor circuit according to claim 1, wherein said conversion circuit is a buck DC-DC converter circuit, wherein said conversion circuit further comprises:
    a DC source;
    a switching transistor;
    a pulse generator;

a diode; and a capacitor;

wherein a first terminal of said switching transistor is connected to said DC source, wherein a second terminal of said switching transistor is connected to a first terminal of said inductor and a cathode terminal of said diode, wherein a third terminal of said switching transistor is connected to said pulse generator, wherein a second terminal of said inductor is connected to said output terminal of said conversion circuit and a first terminal of said capacitor, wherein an anode terminal of said diode and a second terminal of said capacitor are grounded.

3. The thermal sensor circuit according to claim 1, wherein said conversion circuit is a boost DC-DC converter circuit, wherein said conversion circuit further comprises:

a DC source;

a switching transistor;

a pulse generator;

a diode; and a capacitor;

wherein a first terminal of said inductor is connected to said DC source, wherein a second terminal of said inductor is connected to a first terminal of said switching transistor and an anode terminal of said diode, wherein a cathode terminal of said diode is connected to said output terminal of said conversion circuit and a first terminal of said capacitor, wherein a second terminal of said switching transistor and a second terminal of said capacitor are grounded, wherein a third terminal of said switching transistor is connected to said pulse generator.

4. The thermal sensor circuit according to claim 1, wherein said thermal sensor is a thermal sensing acoustic wave resonator which is one selected from the group consisting of a bulk acoustic wave resonator, a thin film bulk acoustic wave resonator and a surface acoustic wave resonator.

5. The thermal sensor circuit according to claim 4, wherein said thermal sensing acoustic wave resonator is formed on a substrate, wherein the material of said substrate is one material selected from the group consisting of glass, $LiTaO_3$, $LiNbO_3$, quartz, Si, GaAs, GaP, sapphire, $Al_2O_3$, InP, SiC, diamond, GaN and AlN.

6. The thermal sensor circuit according to claim 1, further comprising a bias adjustment circuit, wherein said conversion circuit and said bias adjustment circuit form an active adjustment circuit, wherein an input terminal of said bias adjustment circuit is connected to said output terminal of said conversion circuit, wherein said bias adjustment circuit adjusts said converted circuit signal received from said output terminal of said conversion circuit and outputs an active thermal compensating signal through an output terminal of said active adjustment circuit.

7. A thermal sensor circuit comprising:

a conversion circuit, wherein said conversion circuit comprises:

a DC source;

a switching transistor;

a pulse generator;

an inductor;

a capacitor; and an output terminal of said conversion circuit for outputting a converted circuit signal;

wherein a first terminal of said switching transistor is connected to said DC source, wherein a second terminal of said switching transistor is connected to a cathode terminal of a thermal sensitive diode sensor and a first terminal of said inductor, wherein a third terminal of said switching transistor is connected to said pulse generator, wherein a second terminal of said inductor is connected to said output terminal of said conversion circuit and a first terminal of said capacitor, wherein an anode terminal of said thermal sensitive diode sensor and a second terminal of said capacitor are grounded;

wherein said thermal sensitive diode sensor senses a thermal variation correlated to a variation of a forward voltage of said thermal sensitive diode sensor, wherein said variation of said forward voltage of said thermal sensitive diode sensor causes a variation of said converted circuit signal, hence said variation of said converted circuit signal is correlated to said thermal variation.

8. The thermal sensor circuit according to claim 7, further comprising a bias adjustment circuit, wherein said conversion circuit and said bias adjustment circuit form an active adjustment circuit, wherein an input terminal of said bias adjustment circuit is connected to said output terminal of said conversion circuit, wherein said bias adjustment circuit adjusts said converted circuit signal received from said output terminal of said conversion circuit and outputs an active thermal compensating signal through an output terminal of said active adjustment circuit.

9. A thermal sensor circuit comprising:

a conversion circuit, wherein said conversion circuit comprises:

a DC source;

a switching transistor;

a pulse generator;

an inductor;

a capacitor; and an output terminal of said conversion circuit for outputting a converted circuit signal;

wherein a first terminal of said inductor is connected to said DC source, wherein a second terminal of said inductor is connected to an anode terminal of a thermal sensitive diode sensor and a second terminal of said switching transistor, wherein a third terminal of said switching transistor is connected to said pulse generator, wherein a cathode terminal of said thermal sensitive diode sensor is connected to said output terminal of said conversion circuit and a first terminal of said capacitor, wherein a first terminal of said switching transistor and a second terminal of said capacitor are grounded;

wherein said thermal sensitive diode sensor senses a thermal variation correlated to a variation of a forward voltage of said thermal sensitive diode sensor, wherein said variation of said forward voltage of said thermal sensitive diode sensor causes a variation of said converted circuit signal, hence said variation of said converted circuit signal is correlated to said thermal variation.

10. The thermal sensor circuit according to claim 9, further comprising a bias adjustment circuit, wherein said conversion circuit and said bias adjustment circuit form an active adjustment circuit, wherein an input terminal of said bias adjustment circuit is connected to said output terminal of said conversion circuit, wherein said bias adjustment circuit adjusts said converted circuit signal received from said output terminal of said conversion circuit and outputs an active thermal compensating signal through an output terminal of said active adjustment circuit.

* * * * *